US012628455B2

(12) United States Patent
Chen et al.

(10) Patent No.: US 12,628,455 B2
(45) Date of Patent: May 12, 2026

(54) PACKAGE STRUCTURE WITH LENS STRUCTURE AND MANUFACTURING METHOD THEREOF

(71) Applicant: Taiwan Semiconductor Manufacturing Company, Ltd., Hsinchu (TW)

(72) Inventors: Yi-Jung Chen, Yilan County (TW); Tsung-Fu Tsai, Changhua County (TW); Szu-Wei Lu, Hsinchu (TW); Wei-An Tsao, Changhua County (TW); Che-Yuan Yang, Hsinchu (TW); Chien-Ting Chen, Taipei (TW); Chih-Chieh Hung, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 1016 days.

(21) Appl. No.: 17/743,463

(22) Filed: May 13, 2022

(65) Prior Publication Data

US 2023/0369370 A1      Nov. 16, 2023

(51) Int. Cl.
| | |
|---|---|
| *H10F 39/00* | (2025.01) |
| *H01L 21/48* | (2006.01) |
| *H01L 23/00* | (2006.01) |
| *H01L 23/31* | (2006.01) |
| *H01L 23/498* | (2006.01) |

(52) U.S. Cl.
CPC ....... *H10F 39/809* (2025.01); *H01L 21/4803* (2013.01); *H01L 23/3107* (2013.01); *H01L 23/49816* (2013.01); *H01L 23/49822* (2013.01); *H10F 39/8063* (2025.01);
(Continued)

(58) Field of Classification Search
CPC .. H10F 39/809; H10F 39/8063; H10F 39/811; H10F 39/804; H01L 21/4803; H01L 23/3107; H01L 23/49816; H01L 23/49822; H01L 24/08; H01L 2224/08145; H01L 21/76898; H01L 23/3128; H01L 24/80; H01L 2224/80006; H01L 2224/80011; H01L 2224/80357; H01L 2224/80895; H01L 2224/80896; H01L 2225/06527; H01L 2225/06541;
(Continued)

(56) References Cited

U.S. PATENT DOCUMENTS

| | | |
|---|---|---|
| 8,993,380 B2 | 3/2015 | Hou et al. |
| 9,281,254 B2 | 3/2016 | Yu et al. |

(Continued)

FOREIGN PATENT DOCUMENTS

CN          112558240 A  *  3/2021  ........... G02B 6/4251

*Primary Examiner* — Ratisha Mehta
*Assistant Examiner* — Sophia W Kao
(74) *Attorney, Agent, or Firm* — JCIPRNET

(57)                ABSTRACT

A package structure includes an optical die, an optical die, a supporting structure, and a lens structure. The optical die includes a photonic region. The optical die is disposed on and electrically coupled to the optical die. The supporting structure is disposed on the optical die, where the electric die is disposed between the supporting structure and the optical die. The lens structure is disposed on the supporting structure and optically coupled to the photonic region of the optical die, where the supporting structure is disposed between the lens structure and the electric die.

20 Claims, 32 Drawing Sheets

(52) U.S. Cl.
CPC ............ *H10F 39/811* (2025.01); *H01L 24/08*
(2013.01); *H01L 2224/08145* (2013.01)

(58) Field of Classification Search
CPC ......... H01L 2225/06565; H01L 21/561; H01L
25/0657; H01L 25/16; H01L 23/49827
See application file for complete search history.

(56) References Cited

U.S. PATENT DOCUMENTS

| | | | |
|---|---|---|---|
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 2014/0145069 A1* | 5/2014 | Earman ................ | H03K 17/941 |
| | | | 250/214 SW |
| 2018/0323320 A1* | 11/2018 | Mehrl .................. | H10H 20/856 |
| 2019/0123109 A1* | 4/2019 | Xie .................... | G02B 19/0076 |
| 2023/0036239 A1* | 2/2023 | Espiritu ................ | H10F 39/804 |
| 2023/0244043 A1* | 8/2023 | Yu ......................... | H10F 39/199 |
| | | | 385/33 |

* cited by examiner

10

700
600
500A
400
300
200
100
800
900
902
904
520

AS2

SW700
SW600
SW500A
SW400
SW300
SW100
SW800

20

700
600
500A
400
300
200
100
906
900
902
904
520
AS2

SW700
SW600
SW500A
SW400
SW300
SW100
SW906

PACKAGE STRUCTURE WITH LENS STRUCTURE AND MANUFACTURING METHOD THEREOF

BACKGROUND

Electrical signaling and processing have been the mainstream techniques for signal transmission and processing. Optical signaling and processing have been used in increasingly more applications in recent years, particularly due to the use of optical fiber-related applications for signal transmission.

The optical signaling and processing are almost always combined with electrical signaling and processing to provide full-fledged applications. For example, the optical fibers may be used for long-range signal transmission, while electrical signals may be used for short-range signal transmission as well as processing and controlling. Accordingly, the devices integrating optical components and electrical components are formed for the conversion between optical signals and electrical signals, as well as the processing of optical signals and electrical signals. Packages thus may include both optical (photonic) dies including optical devices and electronic dies including electronic devices.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
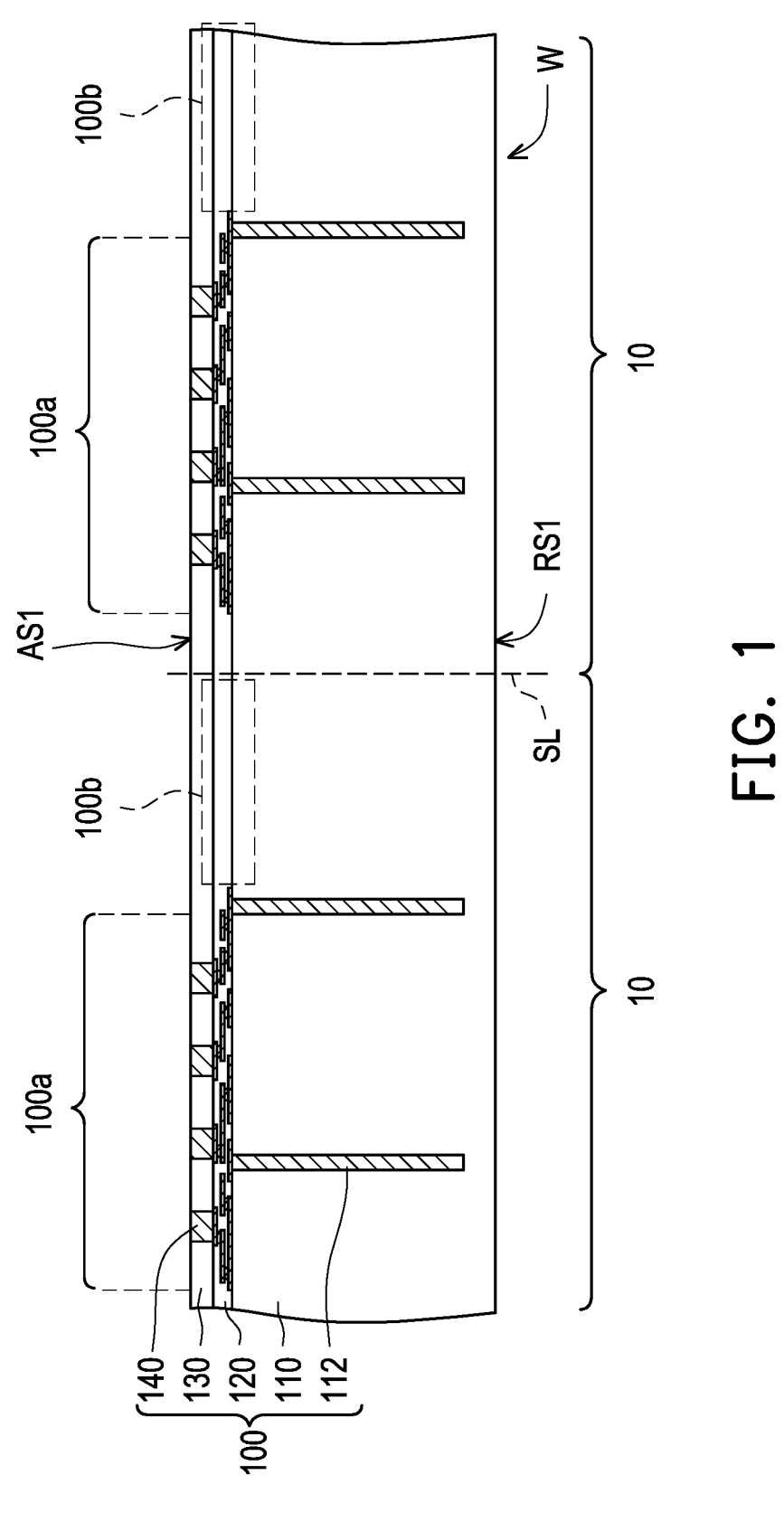
FIG. 1 through FIG. 22 are schematic cross-sectional views or top views of various stages in a manufacturing method of a package structure in accordance with some embodiments of the disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second", and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figures 14A, 14B, 14C:
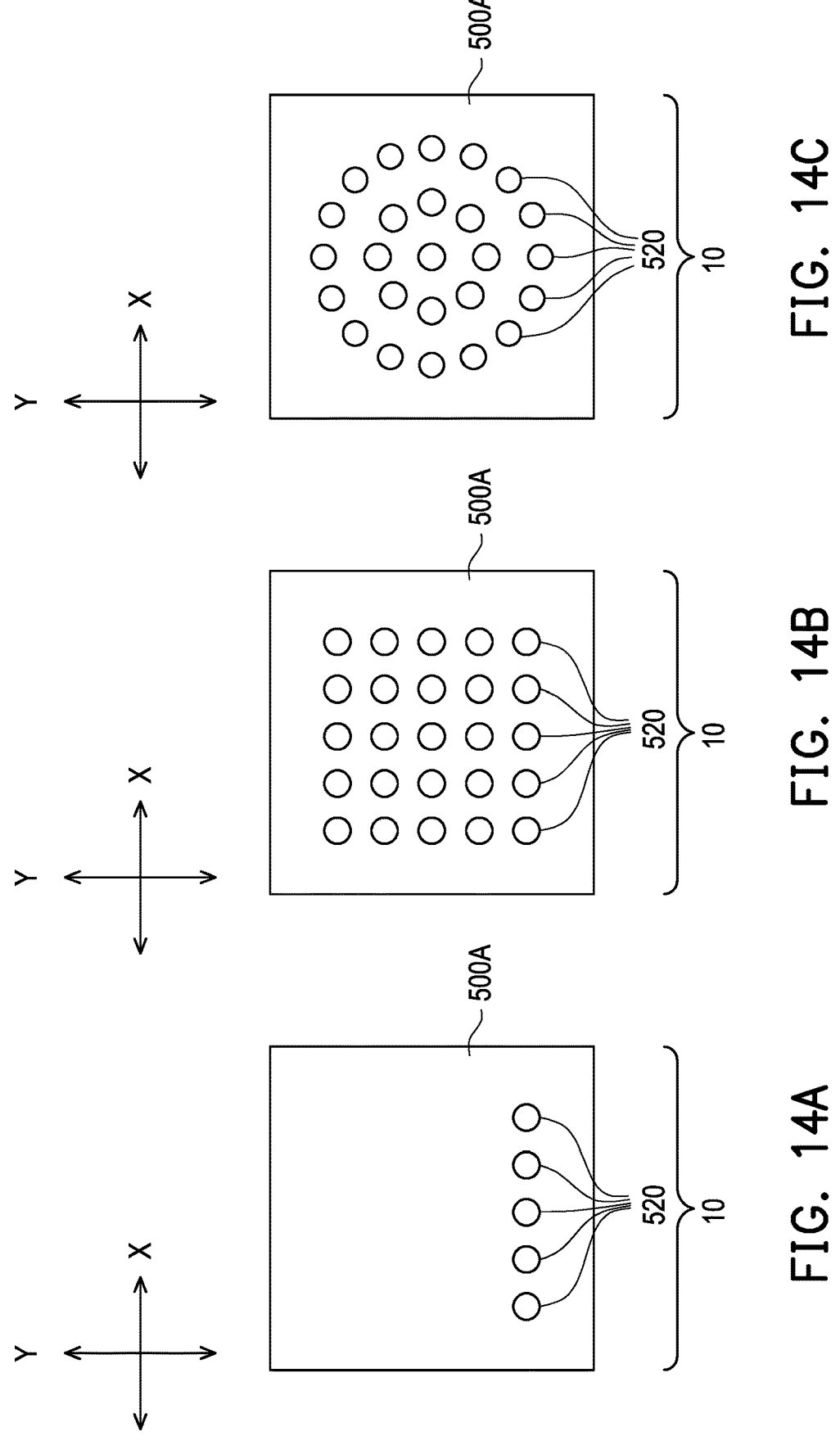
Figures 15A, 15B, 15C:
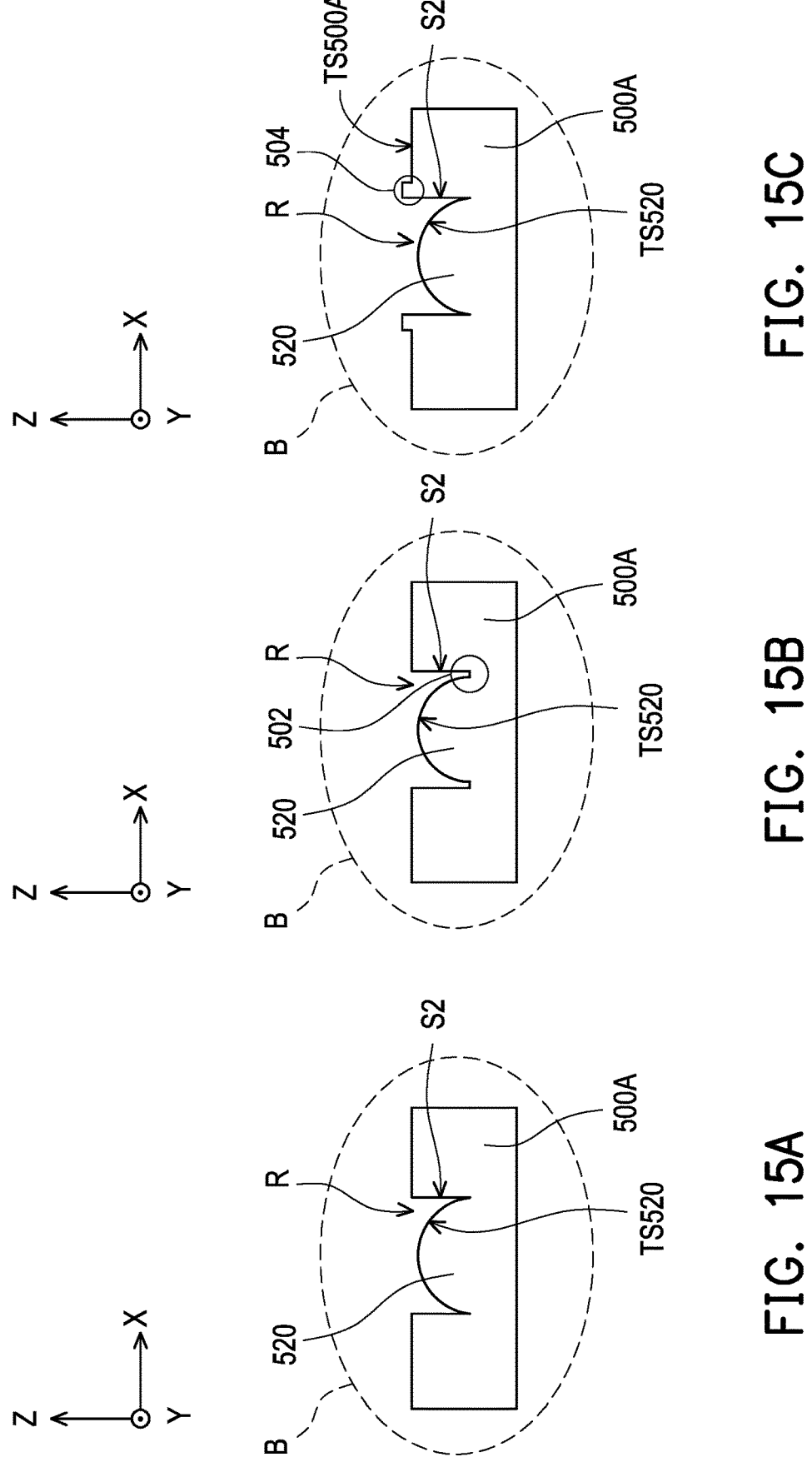

FIG. 1, FIG. 2, FIG. 3, FIG. 4, FIG. 5, FIG. 6, FIG. 7, FIG. 8, FIG. 9, FIG. 10, FIG. 11, FIG. 13, FIG. 16, FIG. 17, FIG. 18, FIG. 19, FIG. 20, FIG. 21, and FIG. 22 are schematic cross-sectional views of various stages in a manufacturing method of a package structure 10 in accordance with some embodiments of the disclosure. FIG. 12A through FIG. 12C are respectively an enlarged and schematic top view showing a position configuration between a photoresist layer and a hard mask layer in a dashed area A outlined in FIG. 11 for in the package structure 10. FIG. 14A through FIG. 14C are respectively a schematic top view showing a position configuration between a lens structure and a supporting structure underlying thereto in the package structure 10. FIG. 15A through FIG. 15C are respectively an enlarged and schematic cross-sectional view showing a lens and a portion of supporting structure in a dashed area B outlined in FIG. 13 for in the package structure 10. In embodiments, the manufacturing method is part of a wafer level packaging process. It is to be noted that the process steps described herein cover a portion of the manufacturing processes used to fabricate the (semiconductor) package structure involving a semiconductor component such as a semiconductor device (or die/chip). The embodiments are intended to provide further explanations but are not used to limit the scope of the disclosure. In the disclosure, it should be appreciated that the illustration of components throughout all figures is schematic and is not in scale.

Referring to FIG. 1, in some embodiments, a photonic wafer W including a plurality of photonic integrated circuit components 100 therein is provided. The photonic integrated circuit components 100 are arranged in array and physically connected to one another. The photonic wafer W may include a plurality of package regions 10 each being configurated to identify the forming location of one package structure 10. In each package region 10, one or more photonic integrated circuit components 100 may be included. For example, the photonic integrated circuit components 100 are arranged in the form of a matrix (such as a N×N array or a N×M array, where N, M>0, N may or may not be equal to M) within at least one or each of the package regions 10. In some embodiments, the photonic integrated circuit components 100 each are be referent to as an optical integrated circuit component, an optical or photonic die, an optical or photonic chip, an optical or photonic integrated circuit.

Each one of the photonic integrated circuit components 100 respectively includes an electrical bonding portion 100a and at least one optical input/output portion 100b configured to transmit and receive optical signal, in some embodiments. The optical signal is, for example, pulsed light, light with continuous wave (CW) or the combinations thereof. The electrical bonding portions 100a of the photonic integrated circuit components 100 may include semiconductor devices (e.g., active components such as transistors and so on, passive components such as capacitors, resistor, inductor, and so on, or combinations thereof), wirings, or conductors for electrical connection. The optical input/output portions 100b of the photonic integrated circuit components 100 may include semiconductor devices and optical devices for processing s, receiving, and/or transmitting the optical signal. For example, the semiconductor devices formed in the optical input/output portions 100b may include transistors, capacitors, photodiodes or the combination thereof, and the optical devices formed in the optical input/output portions 100b may include modulators, grating couplers, input-output (I/O) couplers, edge couplers, waveguides, filters, reflector, lasers, detectors, splitters, converters, switches, or the combination thereof. For example, light-to-electrical conversion devices (e.g., photo-diodes) and/or electrical-to-light conversion devices (e.g., light emitting didoes, lamps, or the like) may be built inside the photonic integrated circuit components 100 or external to and attached to the photonic integrated circuit components 100.

As shown in FIG. 1, for example, the photonic wafer W may include a first active surface AS1 and a first rear surface RS1 opposite to the first active surface AS1 along a direction Z, wherein the electrical bonding portions 100a and the optical input/output portions 100b are located at the first active surface AS1 of the photonic wafer W, where the electrical bonding portions 100a and the optical input/output portions 100b are disposed next to each other along a direction X or/and a direction Y. The directions X, Y, and Z may be different. The direction Z is perpendicular to the direction X and the direction Y, and the direction X is perpendicular to the direction Y, for example.

The photonic wafer W may include a first semiconductor substrate 110 having a plurality of semiconductor devices and optical devices formed therein and/or thereon, a first interconnection structure 120 disposed on the first semiconductor substrate 110, a first dielectric layer 130 covering the first interconnection structure 120 and a plurality of first conductors 140. The first conductors 140 are embedded in the first dielectric layer 130. The first conductors 140 are electrically connected to the first semiconductor substrate 110 through the first interconnection structure 120. The first semiconductor substrate 110 may include a semiconductor substrate (e.g., a silicon substrate, a silicon germanium substrate, etc.), a dielectric substrate, or a substrate formed of other semiconductor materials.

The first interconnection structure 120 may include a dielectric structure having one or more inter-dielectric layers and one or more patterned conductive layers embedded in the dielectric structure for providing routing function to the active components and the passive components embedded in/on the first interconnection structure 120. In one embodiment, more inter-dielectric layers and one or more patterned conductive layers are stacked alternately along the direction Z. For example, the inter-dielectric layers may be silicon oxide layers, silicon nitride layers, silicon oxynitride layers, or dielectric layers formed by other suitable dielectric materials, and the inter-dielectric layers may be formed by deposition or the like. For example, the patterned conductive layers may be patterned copper layers or other suitable patterned metal layers, and the patterned conductive layers may be formed by electroplating or deposition. However, the disclosure is not limited thereto. The numbers of the layers of the inter-dielectric layers and the patterned conductive layers may be designated based on the demand and/or design layout, and is not specifically limited to the disclosure.

The first conductors 140 may be made of metal or metal alloy, and the first dielectric layer 130 may be made of a dielectric material. For example, the material of the first conductors 140 is copper (Cu) or other suitable metallic material while the material of the first dielectric layer 130 is silicon oxide (SiOx, where x>0), silicon nitride (SiNx, where x>0), silicon oxynitride (SiOxNy, where x>0 and y>0) or other suitable dielectric material. The first dielectric layer 130 may be formed by depositing a dielectric material layer on the first interconnection structure 120 and patterning the dielectric material layer to form a plurality of openings (not labelled) in the dielectric material layer. The openings formed in the first dielectric layer 130 expose portions of the first interconnection structure 120. After the first dielectric layer 130 is patterned, a conductive material layer may be deposited on the first dielectric layer 130 and the portions of the first interconnection structure 120 exposed by the openings of the first dielectric layer 130.

Then, a polishing process (e.g., a mechanical grinding process, a chemical mechanical polishing (CMP) process, an etching process, or a combination thereof) is performed to partially remove the conductive material layer until the top surface of the first dielectric layer 130 is exposed. After performing the polishing process, the first conductors 140 are formed in the openings of the first dielectric layer 130. As shown in FIG. 1, for example, the top surfaces of the first conductors 140 and the top surface of the first dielectric layer 130 are substantially at the same level so as to provide an appropriate surface for bonding (such as a hybrid bonding and/or a fusion bonding). After the polishing process, a cleaning step may be optionally performed, for example to clean and remove the residue generated from the polishing process. However, the disclosure is not limited thereto, and the polishing process may be performed through any other suitable method.

As shown in FIG. 1, the photonic wafer W may further include a plurality of first through semiconductor vias (TSV) 112 embedded in the first semiconductor substrate 110. The first TSVs 112 are electrically connected to the first interconnection structure 120 and extend downward into the first semiconductor substrate 110 without penetrating the first semiconductor substrate 110, for example. In other words, the first TSVs 112 embedded in the first semiconductor substrate 110 are not exposed at the first rear surface RS1 of the photonic wafer W.

In alternative embodiments, each of the first TSVs 112 is laterally covered by a liner (not shown). For example, the liners are formed between the first TSVs 112 and the first semiconductor substrate 110. The liners may be formed of a barrier material, such as TiN, Ta, TaN, Ti, or the like. In yet alternative embodiments, a dielectric liner (not shown) (e.g., silicon nitride, an oxide, a polymer, a combination thereof, etc.) may be further optionally formed between the liners and the first semiconductor substrate 110. In some embodiments, the first TSVs 112, the liners, and the optional dielectric liner are formed by forming a plurality of recesses in the first semiconductor substrate 110 and respectively depositing a dielectric material, a barrier material, and a conductive material (e.g., copper, tungsten, aluminum, silver, combinations thereof, or the like) in the recesses, removing excess materials on the first semiconductor substrate 110. For example, the recesses of the first semiconductor substrate 110 are lined with the dielectric liner so as to laterally separate the liners lining sidewalls of the first TSVs 112 from the first semiconductor substrate 110. In some embodiments, as shown in FIG. 1, the first TSVs 112 are formed by using a via-first approach, which are formed prior to the formation of the first interconnect structure 120, as shown in FIG. 1. Alternatively, the first TSVs 112 may be formed by using a via-last approach, and may be formed after the formation of the first interconnect structure 120. The liners and/or the additional dielectric liners may be omitted.

The photonic wafer W may be placed onto a temporary carrier (not shown) to securely hold the photonic wafer W during the sequent processes. For example, the temporary carrier is a wafer-level carrier. In some embodiments, the wafer-level carrier is a glass carrier or any suitable carrier for carrying a semiconductor wafer or a reconstituted wafer (such as the photonic wafer W) for the manufacturing method of the package structure 10. In some embodiments, the wafer-level carrier is coated with a debond layer (not shown). The material of the debond layer may be any material suitable for bonding and de-bonding the wafer-level carrier from the above layer(s) or any wafer(s) disposed thereon. In some embodiments, the debond layer includes a dielectric material layer made of a dielectric material including any suitable polymer-based dielectric material (such as benzocyclobutene ("BCB"), polybenzoxazole ("PBO")). In an alternative embodiment, the debond layer includes a dielectric material layer made of an epoxy-based thermal-release material, which loses its adhesive property when heated, such as a light-to-heat-conversion (LTHC) release coating film. In a further alternative embodiment, the debond layer includes a dielectric material layer made of an ultra-violet (UV) glue, which loses its adhesive property when exposed to UV lights. The debond layer may be dispensed as a liquid and cured, or may be a laminate film laminated onto the wafer-level carrier, or may be the like. The top surface of the debond layer, which is opposite to a bottom surface contacting the wafer-level carrier, may be levelled and may have a high degree of coplanarity. The debond layer is, for example, a LTHC layer with good chemical resistance, and such layer enables room temperature de-bonding from the wafer-level carrier by applying laser irradiation, however the disclosure is not limited thereto. In the embodiments of which the wafer-level carrier and the debond layer are presented, the debond layer is sandwiched between the photonic wafer W and the wafer-level carrier.

Alternatively, the temporary carrier may be a holding device. For example, the holding device includes an adhesive tape, a carrier film or a suction pad. The disclosure is not limited thereto. In the embodiments of which the holding device is employed, the photonic wafer W is disposed over and in physical contact with the holding device.

Figure 2:
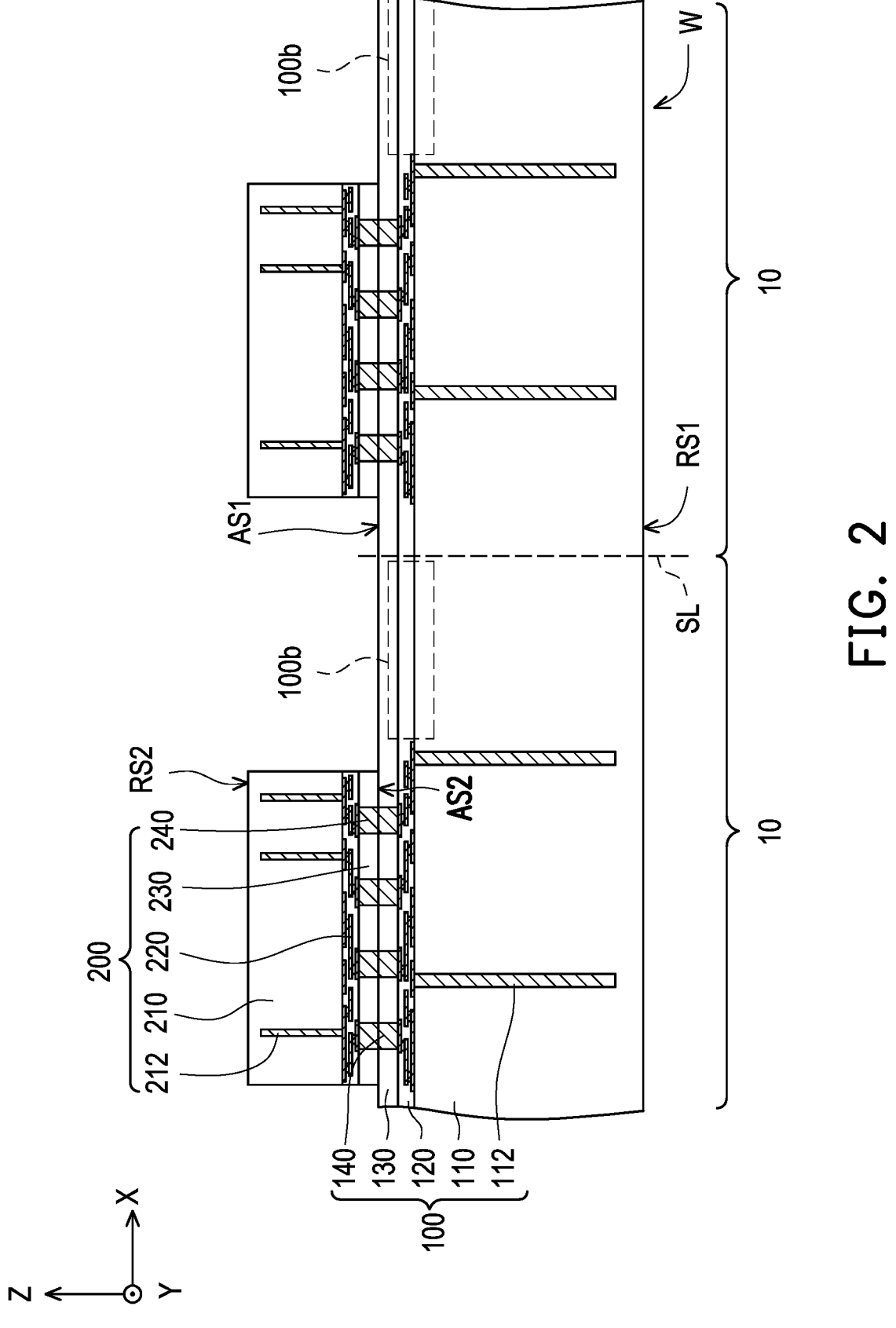

Referring to FIG. 2, in some embodiments, a plurality of electric integrated circuit components 200 are provided. Each one of the electric integrated circuit components 200 may respectively include a second semiconductor substrate 210 having a plurality of semiconductor devices formed therein, a second interconnection structure 220 disposed on the second semiconductor substrate 210, a second dielectric layer 230 covering the second interconnection structure 220 and a plurality of second conductors 240. The second conductors 240 are embedded in the second dielectric layer 230. The second conductors 240 are electrically connected to the second semiconductor substrate 210 through the second interconnection structure 220. In some embodiments, the electric integrated circuit components 200 each are be referent to as a logic integrated circuit component, a logic or electric die, a logic or electric chip, a logic or electric integrated circuit to process the electric signal transmitted from the photonic integrated circuit components 100.

As shown in FIG. 2, each one of the electric integrated circuit components 200 may respectively include a second active surface AS2 and a second rear surface RS2 opposite to the second active surface AS2 along the direction Z. In some embodiments, each electric integrated circuit component 200 optionally includes a plurality of second through semiconductor vias (TSV) 212 embedded in the second semiconductor substrate 210. For example, the second TSVs 212 are electrically connected to the second interconnection structure 220 and extend into the second semiconductor substrate 210 without penetrating the second semiconductor substrate 210. In other words, the second TSVs 212 embedded in the second semiconductor substrate 210 are not exposed at the second rear surface RS2 of the electric integrated circuit component 200. The second TSVs 212 may be omitted, alternatively. In addition, for the second TSVs 212, liners and/or additional dielectric liners may be optionally adopted, and the details of the liners and/or additional dielectric liners have been discussed in FIG. 1; thus, are not repeated herein.

The details of the second semiconductor substrate 210, the second interconnection structure 220, the second dielectric layer 230, the second conductors 240, and the second TSVs 212 are similar to or substantially identical to the details of the first semiconductor substrate 110, the first interconnection structure 120, the first dielectric layer 130, the first conductors 140, and the first TSVs 112, and thus are not repeated herein for brevity. In some embodiments, the material of the second conductors 240 may be copper (Cu) or other suitable metallic material while the material of the second dielectric layer 230 may be silicon oxide (SiOx, where x>0), silicon nitride (SiNx, where x>0), silicon oxynitride (SiOxNy, where x>0 and y>0) or other suitable dielectric material.

The electric integrated circuit components 200 may be picked-up and placed onto the first active surface AS1 of the photonic wafer W such that the first active surface AS1 of the photonic wafer W is in contact with the second active surfaces AS2 of the electric integrated circuit components 200, and the second conductors 240 of the electric integrated circuit components 200 are substantially aligned and in contact with the first conductors 140 of the photonic integrated circuit components 100 in the photonic wafer W. The electric integrated circuit components 200 are picked-up and placed to cover the electrical bonding portions 100a of photonic integrated circuit components 100, and the optical input/output portions 100*b* of the photonic integrated circuit components 100 are not covered by the electric integrated circuit components 200.

In some embodiments, after the electric integrated circuit components 200 are picked-up and placed on the photonic integrated circuit components 100, a grinding process may be performed to reduce the thickness of the electric integrated circuit components 200. The above-mentioned grinding process may be CMP process, a mechanical grinding process, an etching process, a combination thereof or other suitable processes. After performing the grinding process of the electric integrated circuit components 200, the second TSVs 212 embedded in the second semiconductor substrate 210 are not exposed at the second rear surface RS2 of the electric integrated circuit component 200. After the grinding process, a cleaning step may be optionally performed, for example to clean and remove the residue generated from the grinding process. However, the disclosure is not limited thereto, and the grinding process may be performed through any other suitable method.

The electric integrated circuit components 200 placed on the photonic wafer W may be arranged in array. For example, the electric integrated circuit components 200 are arranged in the form of a matrix (such as a N'×N' array or a N'×M' array, where N', M'>0, N' may or may not be equal to M') within at least one or each of photonic integrated circuit components 100 inside at least one or each of the package regions 10. The disclosure is not specifically limited as long as the electric integrated circuit components 200 are offset from the optical input/output portions 100*b* of the photonic integrated circuit components 100 in a vertical projection on the photonic wafer W along the direction Z.

The electric integrated circuit components 200 may be mounted to the photonic integrated circuit components 100 by hybrid bonding. In some embodiments, to facilitate the chip-to-wafer hybrid bonding between the electric integrated circuit components 200 and the photonic wafer W, surface preparation for bonding surfaces (i.e., the first active surface AS1 and the second active surface AS2) of the photonic wafer W and the electric integrated circuit components 200 may be performed. The surface preparation may include surface cleaning and activation, for example. Surface cleaning may be performed on the first active surface AS1 of the photonic wafer W and the second active surface AS2 of the electric integrated circuit components 200 so as to remove particles on top surfaces of the first conductors 140, the first dielectric layer 130, the second conductors 240 and the second dielectric layer 230. The first active surface AS1 of the photonic wafer W and the second active surface AS2 of the electric integrated circuit components 200 may be cleaned by wet cleaning, for example. Not only particles are removed, but also native oxide formed on the top surfaces of the first conductors 140 and the second conductors 240 may be removed. The native oxide formed on the top surfaces of the first conductors 140 and the second conductors 240 may be removed by chemicals used in the wet cleaning, for example.

After cleaning the first active surface AS1 of the photonic wafer W and the second active surface AS2 of the electric integrated circuit components 200, activation of the top surfaces of the first dielectric layer 130 and the second dielectric layer 230 may be performed for development of high bonding strength. In some embodiments, plasma activation may be performed to treat the top surfaces of the first dielectric layer 130 and the second dielectric layer 230. When the activated top surface of the first dielectric layer 130 is in contact with the activated top surface of the second dielectric layer 230, the first dielectric layer 130 of the photonic wafer W and the second dielectric layer 230 of the electric integrated circuit components 200 are pre-bonded. In other words, the photonic wafer W and the electric integrated circuit components 200 are pre-bonded through the pre-bonding of the first dielectric layer 130 and the second dielectric layer 230. After the first dielectric layer 130 and the second dielectric layer 230 are pre-bonded, the first conductors 140 are in contact with and electrically connected to the second conductors 240.

After pre-bonding the electric integrated circuit components 200 onto the photonic wafer W, hybrid bonding of the electric integrated circuit components 200 and the photonic wafer W is performed. The hybrid bonding of the electric integrated circuit components 200 and the photonic wafer W may include a treatment for dielectric bonding and a thermal annealing for conductor bonding. In some embodiments, the treatment for dielectric bonding is performed to strengthen the bonding between the first dielectric layer 130 and the second dielectric layer 230. For example, the treatment for dielectric bonding may be performed at temperature ranging from about 100 Celsius degrees to about 150 Celsius degrees. For example, the dielectric bonding between the first dielectric layer 130 and the second dielectric layer 230 may be oxide-to-oxide bonding, oxide-to-nitride bonding or nitride-to-nitride bonding. After performing the treatment for dielectric bonding, the thermal annealing for conductor bonding is performed to facilitate the bonding between the first conductors 140 and the second conductors 240.

For example, the thermal annealing for conductor bonding may be performed at temperature ranging from about 300 Celsius degrees to about 400 Celsius degrees. The process temperature of the thermal annealing for conductor bonding is higher than that of the treatment for dielectric bonding. After performing the thermal annealing for conductor bonding, the first dielectric layer 130 is bonded to the second dielectric layer 230 and the first conductors 140 are bonded to the second conductors 240. In some embodiments, the first conductors 140 may be conductive vias (e.g., copper vias), conductive pads (e.g., copper pads) or the combinations thereof while the second conductors 240 may be conductive vias (e.g., copper vias), conductive pads (e.g., copper pads) or the combinations thereof. For example, the conductor bonding between the first conductors 140 and the second conductors 240 may be via-to-via bonding, pad-to-pad bonding or via-to-pad bonding. After performing the hybrid bonding of the electric integrated circuit components 200 and the photonic wafer W (e.g., the photonic integrated circuit components 100), the first interconnection structure 120 and the second interconnection structure 220 are electrically connected to each other through the first conductors 140 and the second conductors 240.

Alternatively, the electric integrated circuit components 200 may be mounted to the photonic integrated circuit components 100 by flip-chip bonding. In some embodiments, to facilitate the chip-to-wafer flip-chip bonding between the electric integrated circuit components 200 and the photonic wafer W, solder regions are further provided between the first conductors 140 of the photonic integrated circuit components 100 and the second conductors 240 of the electric integrated circuit components 200 to form solder joints for electrically connecting therebetween. For example, the conductor bonding between the first conductors 140 and the second conductors 240 may be via-to-solder joint-to-via bonding, pad-to-solder joint-to-pad bonding or via-to-solder joint-to-pad bonding. The first dielectric layer 130 may be free from (e.g., spaced apart from) the second dielectric layer 230. In the case, there is no dielectric bonding between the first dielectric layer 130 and the second dielectric layer 230. In the embodiments of which flip-chip bonding is employed, an underfill (not shown) may be optionally formed to fill the gaps between the electric integrated circuit components 200 and the photonic wafer W and cover sidewalls of the solder joints. Owing to the underfill, the bonding strength is enhanced, thereby improving the reliability of electrical connections between the electric integrated circuit components 200 and the photonic wafer W. The underfill may be any acceptable material, such as a polymer, epoxy, molding underfill, or the like, for example. The underfill may be formed by underfill dispensing or any other suitable method.

Figure 3:
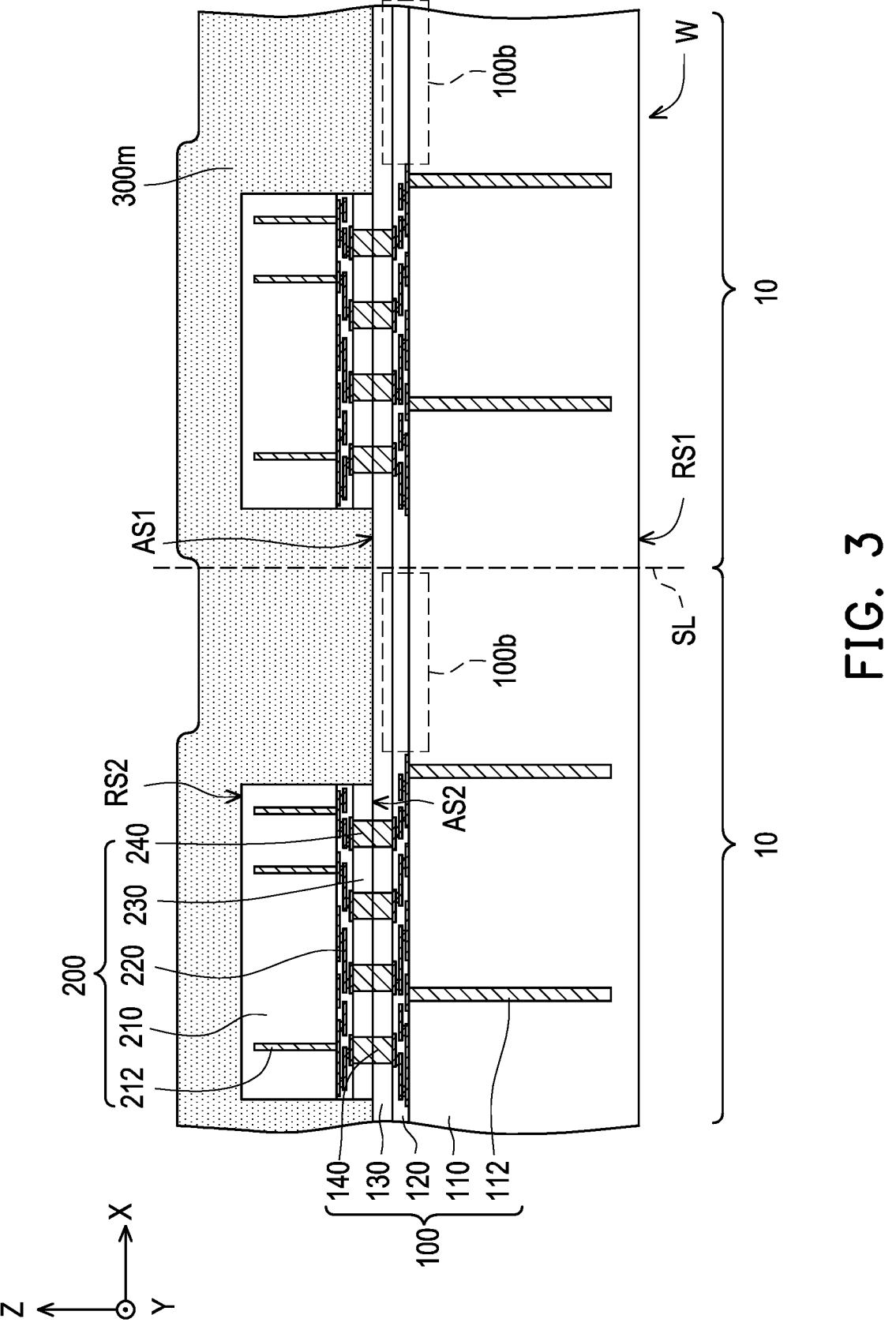

Referring to FIG. 3, in some embodiments, after performing the hybrid bonding of the electric integrated circuit components 200 and the photonic wafer W, an insulating material 300m is formed to cover the optical input/output portions 100b of the photonic wafer W and encapsulate the electric integrated circuit components 200. The maximum thickness of the insulating material 300m may be greater than the thickness of the electric integrated circuit components 200. In some embodiments, the insulating material 300 may be conformally formed by chemical vapor deposition (CVD), or other suitable deposition processes. Furthermore, the insulating material 300m is optically transparent to the optical signal to be processed by the optical input/output portions 100b of the photonic integrated circuit components 100.

In some embodiment, as shown in FIG. 3, the insulating material 300m may be a single-layered structure, and the material of the insulating material 300m may include silicon oxide, silicon nitride, and/or tetraethoxysilane (TEOS). In some alternative embodiments, the insulating material 300m may be a multi-layered structure and include a plurality of stacked dielectric layers in form of conformal layer, where the plurality of stacked dielectric layers of the multi-layered insulating material 300m are optically transparent to the optical signal to be processed by the optical input/output portions 100b and are stacked along the direction Z.

Figure 4:
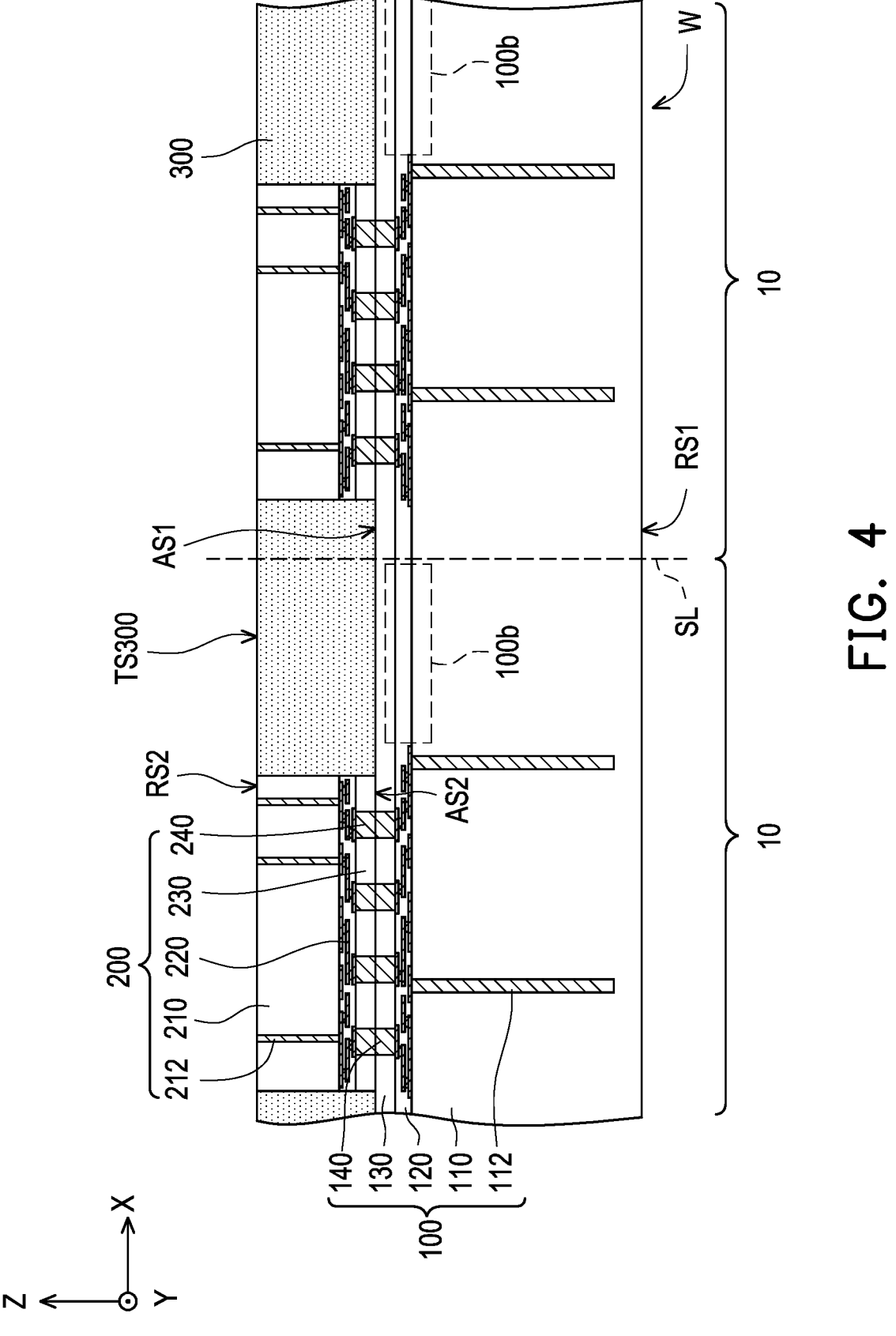

Referring to FIG. 4, in some embodiments, a grinding or polishing process is performed on the insulating material 300m to form an insulating encapsulation 300 exposing the electric integrated circuit components 200. For example, in the grinding or polishing process, the insulating material 300m is partially removed until the rear surfaces RS2 of the electric integrated circuit components 200 are exposed by an insulating encapsulation 300. The insulating material 300m and the electric integrated circuit components 200 may be partially removed by a CMP process, a mechanical grinding process, an etching process, a combination thereof, or other suitable removal processes. After performing the grinding or polishing process, the optical input/output portions 100b of the photonic integrated circuit components 100 are covered by the insulating encapsulation 300, and the electric integrated circuit components 200 are laterally encapsulated by the insulating encapsulation 300, as shown in FIG. 4, for example. Furthermore, the insulating encapsulation 300 physically contacts the sidewalls of the electric integrated circuit components 200. In some embodiments, a surface TS300 of the insulating encapsulation 300 is substantially levelled with the second rear surfaces RS2 of the electric integrated circuit components 200. For example, the surface TS300 of the insulating encapsulation 300 is substantially coplanar to the second rear surfaces RS2 of the electric integrated circuit components 200.

In the embodiments of which the second TSVs 212 are included, as shown in FIG. 4, surfaces (not labelled) of the second TSVs 212 are also exposed by the surface TS300 of the insulating encapsulation 300. During the grinding or polishing process, the electric integrated circuit components 200 may be partially removed, as well. After the grinding or polishing process, a cleaning step may be optionally performed, for example to clean and remove the residue generated from the grinding or polishing process. However, the disclosure is not limited thereto, and the grinding or polishing process may be performed through any other suitable method.

In some embodiments, as shown in FIG. 4, the insulating encapsulation 300 is a single-layered structure, and the material of the insulating encapsulation 300 includes silicon oxide, silicon nitride, and/or tetraethoxysilane (TEOS). In some alternative embodiments, the insulating encapsulation 300 may be a multi-layered structure and include a plurality of stacked dielectric layers, where the plurality of stacked dielectric layers of the multi-layered insulating encapsulation 300 are optically transparent to the optical signal to be processed by the optical input/output portions 100b. Furthermore, the stacked dielectric layers may be formed from multiple layers of alternating dielectric materials (e.g., alternating silicon oxide/silicon nitride layers) with varying refractive index or thickness. The stacked dielectric layers of the multi-layered insulating encapsulation 300 may provide anti-reflection effect.

Figure 5:
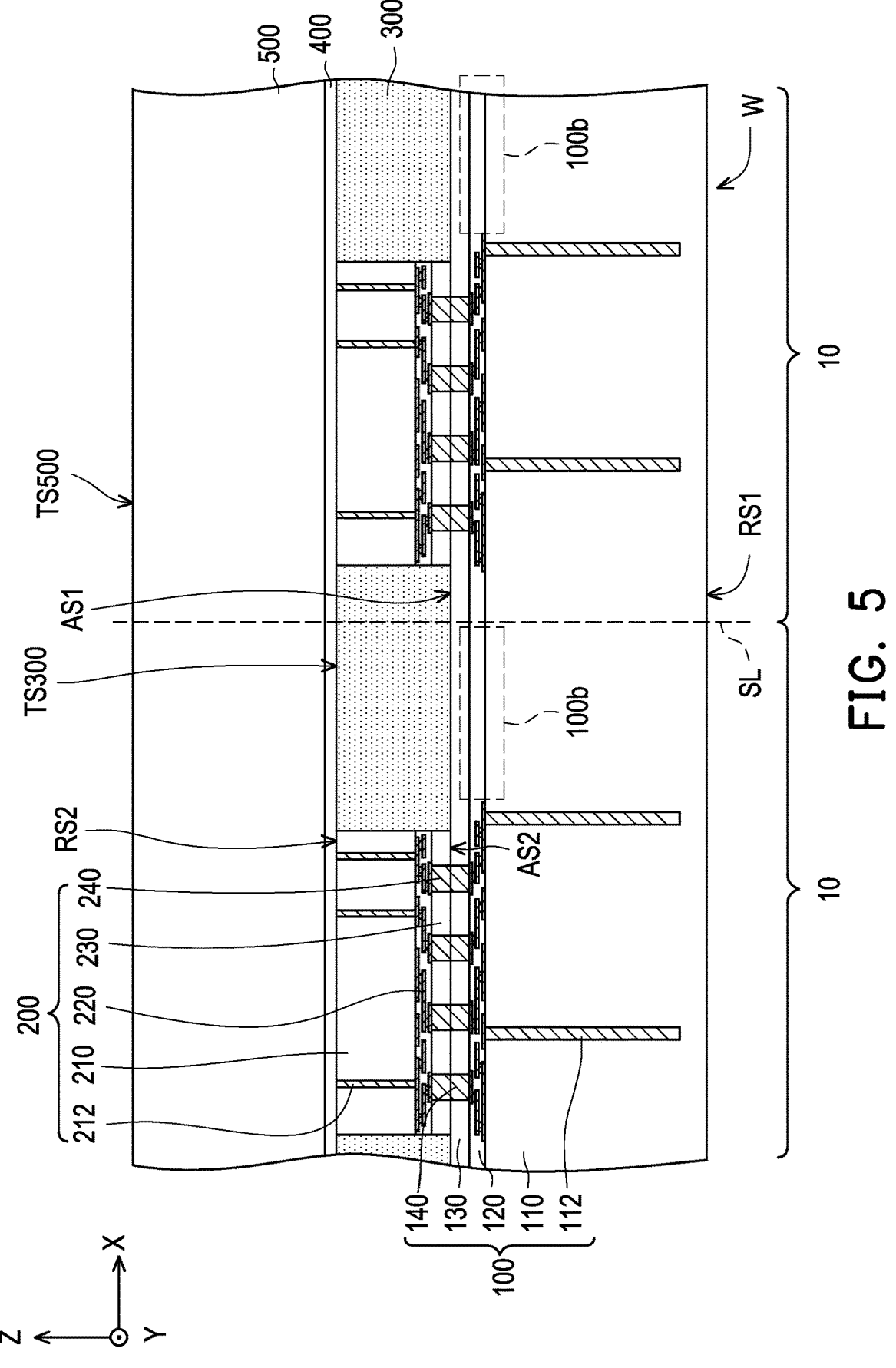

Referring to FIG. 5, in some embodiments, an anti-reflection coating (ARC) layer 400 is conformally formed over the electric integrated circuit components 200 and the insulating encapsulation 300. For example, the ARC layer 400 is disposed on and in physical contact with the second rear surfaces RS2 of the electric integrated circuit components 200 and the surface TS300 of the insulating encapsulation 300. The ARC layer 400 may be made of a dielectric material, and may be formed by any suitable method, such as CVD or atomic layer deposition (ALD). A material of the ARC layer 400 may include silicon oxide such as SiO or SiO$_2$, silicon nitride, silicon oxynitride, or combinations thereof. For example, the ARC layer 400 includes a conformal layer of silicon nitride. The ARC layer 400 may have a thickness of about 300 nm to about 900 nm as measured along the direction Z, although other suitable thickness may alternatively be utilized. The ARC layer 400 may be referred to as an optical layer or film, or an anti-reflection layer or film.

Thereafter, a supporting structure 500 is provided and disposed on the ARC layer 400, as shown in FIG. 5, for example. The supporting structure 500 may be a semiconductor substrate, such as a bulk semiconductor substrate, a semiconductor-on-insulator (SOI) substrate, or the like, which may be doped (e.g., with a p-type or an n-type dopant) or undoped. The supporting structure 500 may be a wafer, such as a silicon wafer. Generally, an SOI substrate is a layer of a semiconductor material formed on an insulator layer. The insulator layer may be a buried oxide (BOX) layer, a silicon oxide layer, or the like. For example, the insulator layer is provided on a substrate, typically a silicon or glass substrate. Other substrates, such as a multilayered or gradient substrate may also be used. In some embodiments, the semiconductor material of the supporting structure 500 includes an elementary semiconductor (e.g., silicon or germanium in a crystalline, a polycrystalline, or an amorphous structure, etc.); a compound semiconductor (e.g., silicon carbide, gallium arsenide, gallium phosphide, indium phosphide, indium arsenide, and/or indium antimonide); an alloy semiconductor (e.g., silicon-germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), and/or gallium indium arsenide phosphide (GaInAsP)); or combinations thereof. The supporting structure 500 may include a dielectric material. For example, the supporting structure 500 is a dielectric substrate, or include a dielectric layer on a semiconductor substrate. Acceptable dielectric materials for dielectric substrates may include oxides such as silicon oxide; nitrides such as silicon nitride; carbides such as silicon carbide; the like; or combinations thereof such as silicon oxynitride, silicon oxycarbide, silicon carbonitride, or the like. The disclosure is not specifically limited, as long as the supporting structure 500 is optically transparent to the targeted wavelength range of the optical signal to-be-transmitted and to-be-received by the optical input/output portion 100*b* underneath thereto.

In some embodiments, as shown in FIG. 5, the supporting structure 500 is formed of silicon, e.g., a silicon substrate. However, the disclosure is not limited thereto. In some embodiments, the supporting structure 500 is bonded to the ARC layer 400 by performing a thermal process to establish bonds (e.g., covalent bonds) between the supporting structure 500 and the ARC layer 400 (e.g., at the interface of the supporting structure 500 and the ARC layer 40). After the placement of the supporting structure 500, a grinding process may be performed to planarize a surface TS500 of the supporting structure 500 to facilitate the formation of layer(s) or component(s) formed in sequent processes. After the grinding process, a cleaning step may be optionally performed, for example to clean and remove the residue generated from the grinding process. However, the disclosure is not limited thereto, and the grinding process may be performed through any other suitable method. As shown in FIG. 5, The ARC layer 400 is disposed between the supporting structure 500 and the insulating encapsulation 300 and between the supporting structure 500 and the electric integrated circuit components 200 and, for example. The electric integrated circuit components 200 and the insulating encapsulation 300 are disposed between the ARC layer 500 and the photonic wafer W, in the case. Owing to the supporting structure 500 of silicon substrate, a low loss purpose during the manufacture is achieved.

Figure 6:
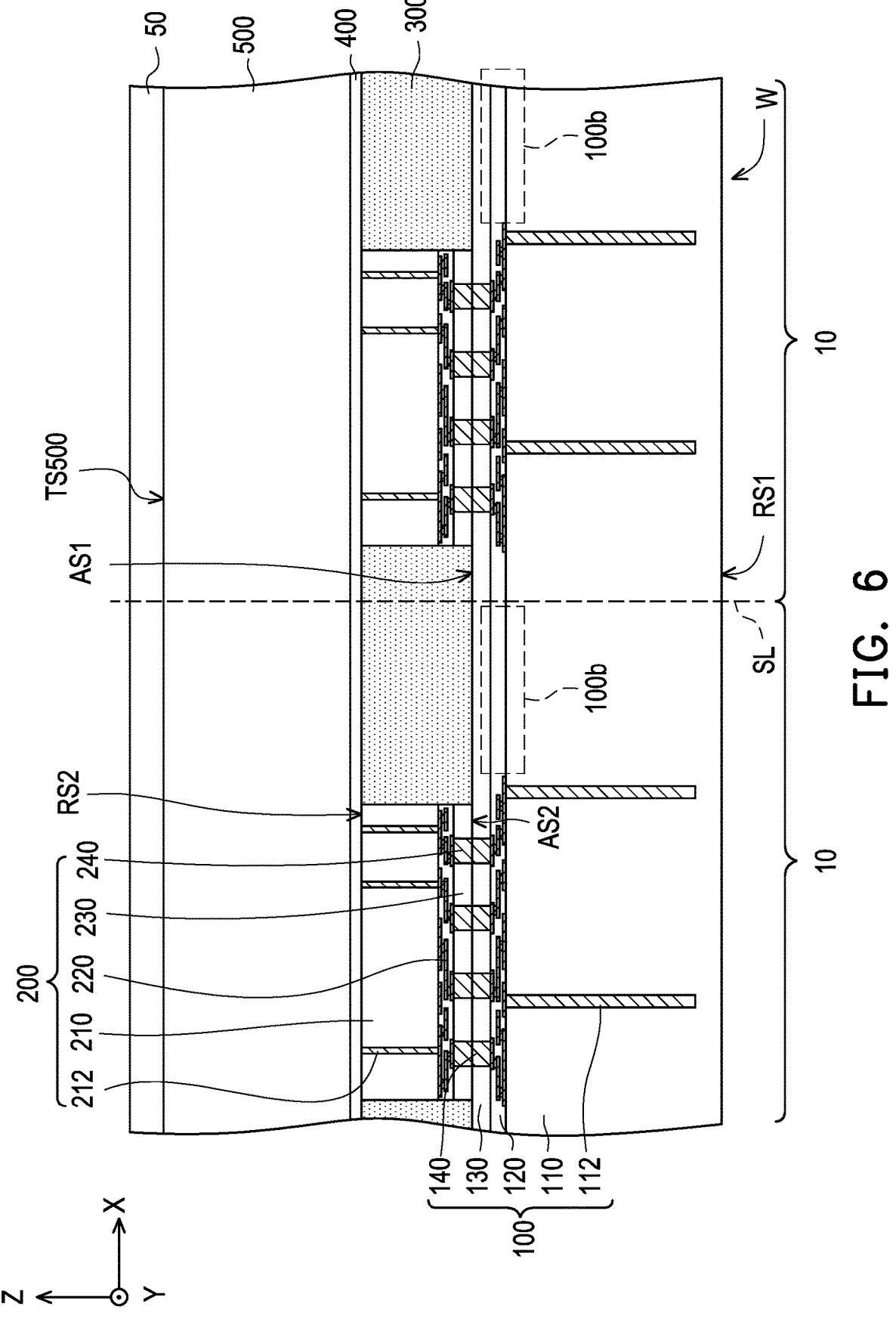

Referring to FIG. 6, in some embodiments, a hard mask material layer 50 is formed on and in contact with the surface TS500 of the supporting structure 500. In some embodiments, the hard mask material layer 50 includes a dielectric material. Acceptable dielectric materials for the hard mask material layer 50 may include oxides such as silicon oxide (SiOx, where x>0); nitrides such as silicon nitride (SiNx, where x>0); carbides such as silicon carbide (SiCx, where x>0); the like; or combinations thereof such as silicon oxynitride (SiOxNy, where x>0 and y>0), silicon oxycarbide (SiOxCy, where x>0 and y>0), silicon carbonitride (SiCxNy, where x>0 and y>0), or the like. For example, the hard mask material layer 50 is made of silicon oxide. The hard mask material layer 50 may be formed by any suitable method, such as CVD or the like. The hard mask material layer 50 may have a thickness of about 1 μm to about 10 μm as measured along the direction Z, although other suitable thickness may alternatively be utilized. As shown in FIG. 6, the supporting structure 500 is disposed between the ARC layer 400 and the hard mask material layer 50, for example.

Figure 7:
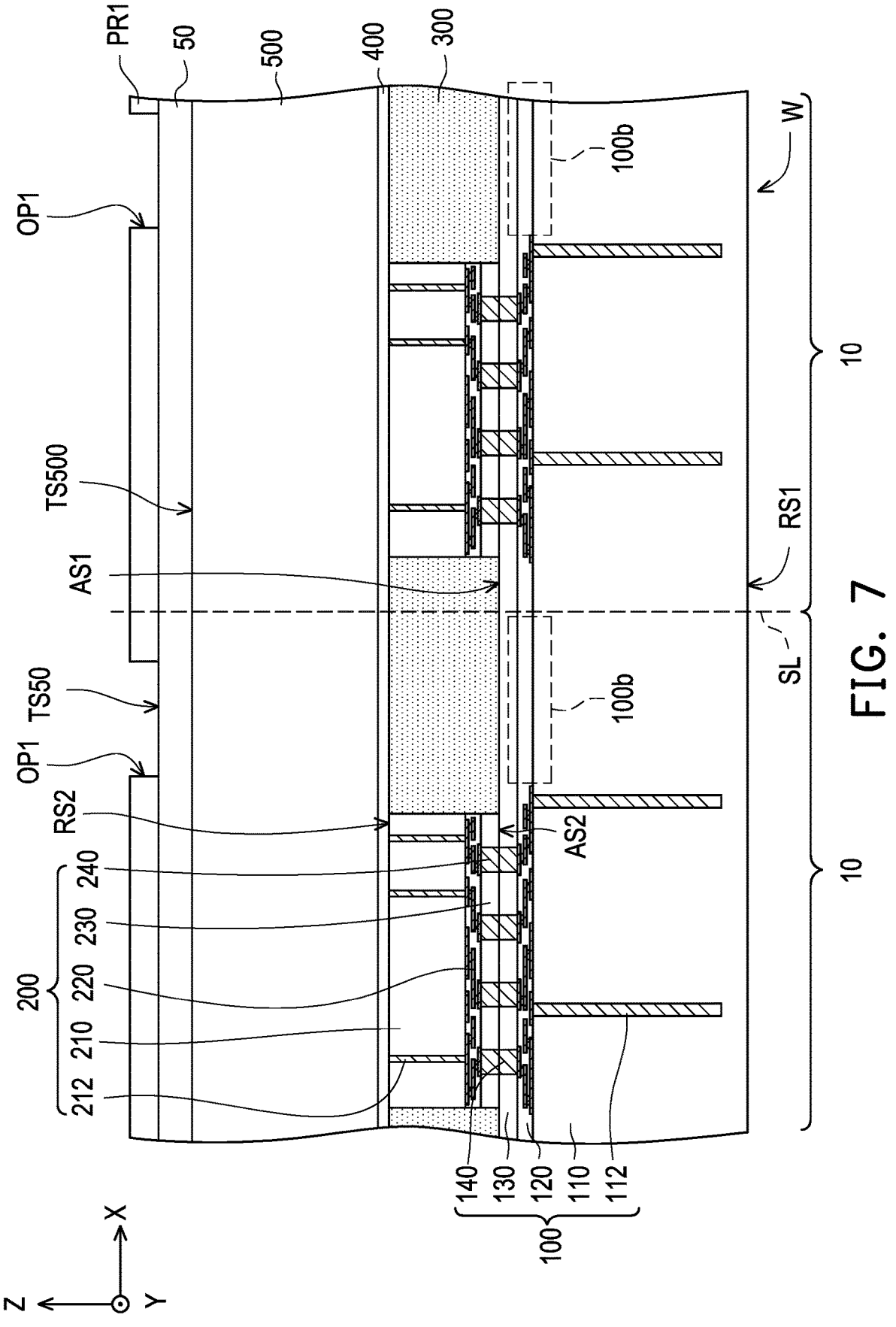

Referring to FIG. 7, in some embodiments, after the formation of the hard mask material layer 50, a first photoresist layer PR1 is formed on and in contact with a surface TS50 of the hard mask material layer 50. For example, the first photoresist layer PR1 includes a plurality of openings (or referred to as holes, via openings, via holes, or recesses) OP1 penetrating therethrough and exposing portions of the hard mask material layer 50 underneath thereto. In other words, the surface TS50 of the hard mask material layer 50 is partially exposed by the openings OP1 formed in the first photoresist layer PR1. In one embodiment, if considering a top view (e.g., a X-Y plane), a shape of the openings OP1 formed in the first photoresist layer PR1 includes a circular shape. However, the disclosure is not limited thereto; alternatively, on the top view, the shape of the openings OP1 may include an elliptical shape, an oval shape, a triangular shape, a rectangular shape, a square shape, or other suitable polygonal shapes. Depending on the demand and design requirement, the number of the openings OP1 may be one or more than one. As shown in FIG. 7, the hard mask material layer 50 is disposed between the supporting structure 500 and the first photoresist layer PR1, for example. In some embodiments, positioning locations of the openings OP1 correspond to (e.g., overlap with) positioning locations of the optical input/output portions 100*b* of the photonic integrated circuit components 100 in the vertical projection on the photonic wafer W along the direction Z. The first photoresist layer PR1 may be formed to a thickness of between about 1 μm and about 15 μm, although other suitable thickness may alternatively be utilized. A material of the first photoresist layer PR1 may include photoresist or polyimide.

The first photoresist layer PR1 may be a photosensitive material utilized to help pattern the hard mask material layer 50 (not shown in FIG. 7 but illustrated and discussed below with respect to FIG. 8). In some embodiments, the photosensitive material of the first photoresist layer PR1 includes a positive resist material or a negative resist material, that is suitable for a patterning process such as a photolithography process with a mask or a mask-less photolithography process (such as an electron-beam (e-beam) writing or an ion-beam writing). In the disclosure, the first photoresist layer PR1 may be referred to as a photo (or photosensitive) resist layer, a photo (or photosensitive) resist, or a resist layer. In some embodiments, the formation of the first photoresist layer PR1 includes, but not limited to, forming a blanket layer (not shown) of photoresist material on the hard mask material layer 50 by a spin-on coating method and the like; and patterning, through a photolithography process, the photoresist material blanket layer so to form the first photoresist layer PR1 with the openings OP1. In addition, before patterning, a pre-baking process may be performed on the photoresist material coating on the hard mask material layer 50 to form a film by removing excess solvent, if need.

For example, the photolithography process being performed on the photoresist material blanket layer includes, but not limited to, placing a photomask (not shown) over the photoresist material blanket layer; performing an exposure process on the photoresist material blanket layer, where a predetermined target pattern included in the photomask is transferred onto the photoresist material blanket layer; removing the photomask; and developing the photoresist material blanket layer to form the first photoresist layer PR1 in a development process. In some embodiments, portions of the photoresist material blanket layer, which are exposed to the light or not exposed to the light (depending on the material(s) or type of the photoresist material used herein), are removed with a development agent in the developing process. The photoresist material blanket layer may be a positive resist layer, and the portions of the photoresist material blanket layer being exposed to the light may be removed to form a pattern having the openings OP1 corresponding to opening/recess regions included in the predetermined target pattern of the photomask with a development agent of a positive resist. Alternatively, the photoresist material blanket layer may be a negative resist layer, and the portions of the photoresist material blanket layer being not exposed to the light may be removed to form a pattern having the openings OP1 corresponding to the non-opening/non-recess regions included in the predetermined target pattern of the photomask with a development agent of a negative resist. The development agent may be chosen based on the type of the photoresist material blanket layer as well as process needs. In some embodiments, the developing process may include, but may not be limited to, a dipping bath process or a spray process, the disclosure is not limited thereto.

Figure 8:
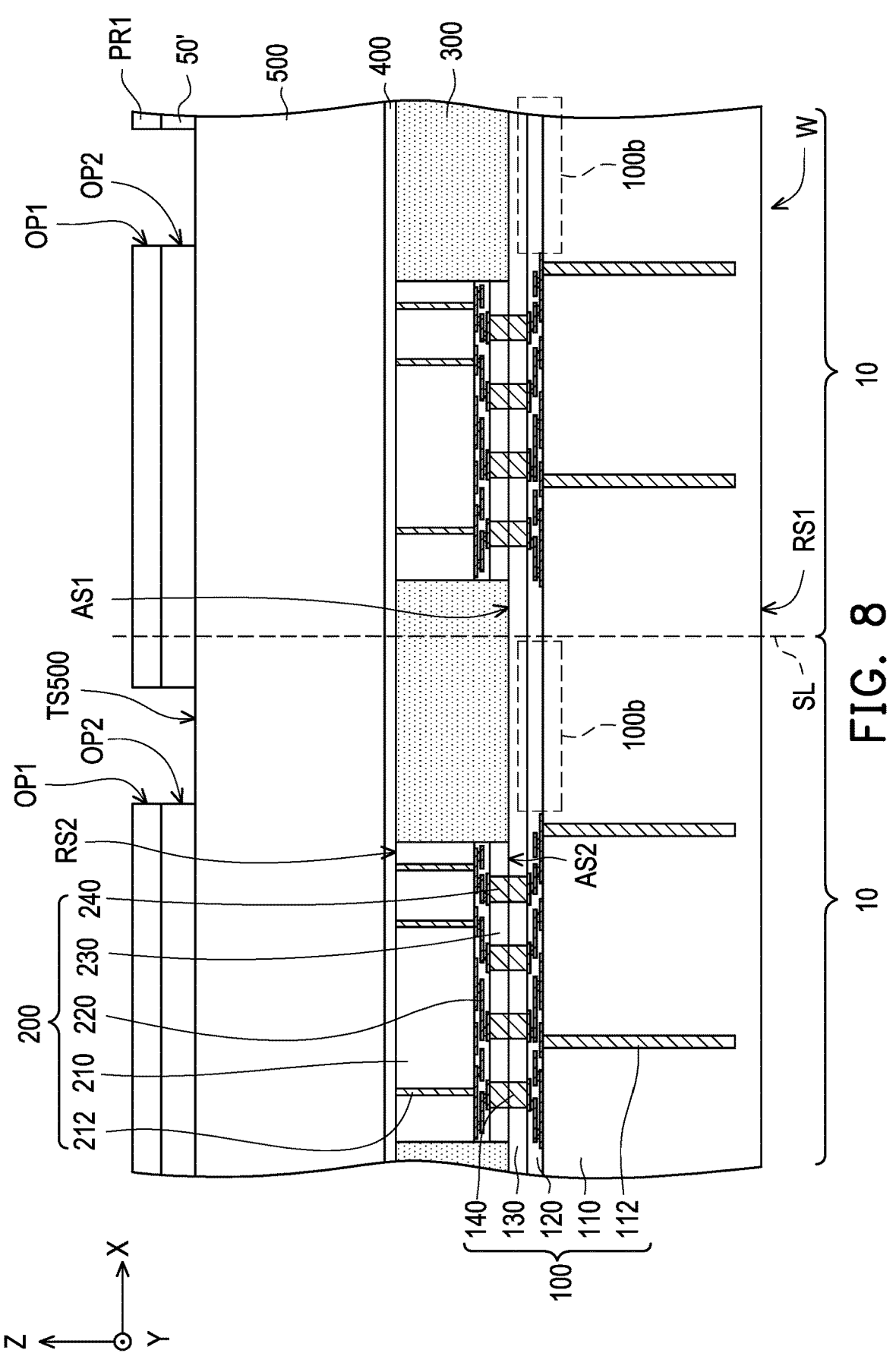

Referring to FIG. 7 and FIG. 8, in some embodiments, the hard mask material layer 50 is patterned by using the first photoresist layer PR1. In the case, as shown in FIG. 8, portions of the hard mask material layer 50 are removed to form a hard mask layer 50' having a plurality of openings (or referred to as holes, via openings, via holes, or recesses) OP2, where the supporting structure 500 (e.g., the surface TS500 thereof) is exposed by the openings OP2 formed in the hard mask layer 50' and the openings OP1 formed in the first photoresist layer PR1 thereon. The patterning process may include an etching process, such as a dry etching. The hard mask layer 50' may have a thickness of about 1 μm to about 10 μm as measured along the direction Z, although other suitable thickness may alternatively be utilized.

As shown in FIG. 8, the openings OP1 may be directly above and spatially communicated with the openings OP2, respectively. For example, sidewalls of the openings OP1 and OP2 may be substantially aligned with one another within the process variations. That is, for example, if considering the top view (e.g., the X-Y plane), a shape of the openings OP2 formed in the hard mask layer 50' is substantially identical to the shape of the openings OP1 formed in the first photoresist layer PR1. The shape of the openings OP2 formed in the hard mask layer 50' may be controlled by adjusting the openings OP1 formed in the first photoresist layer PR1.

Figure 9:
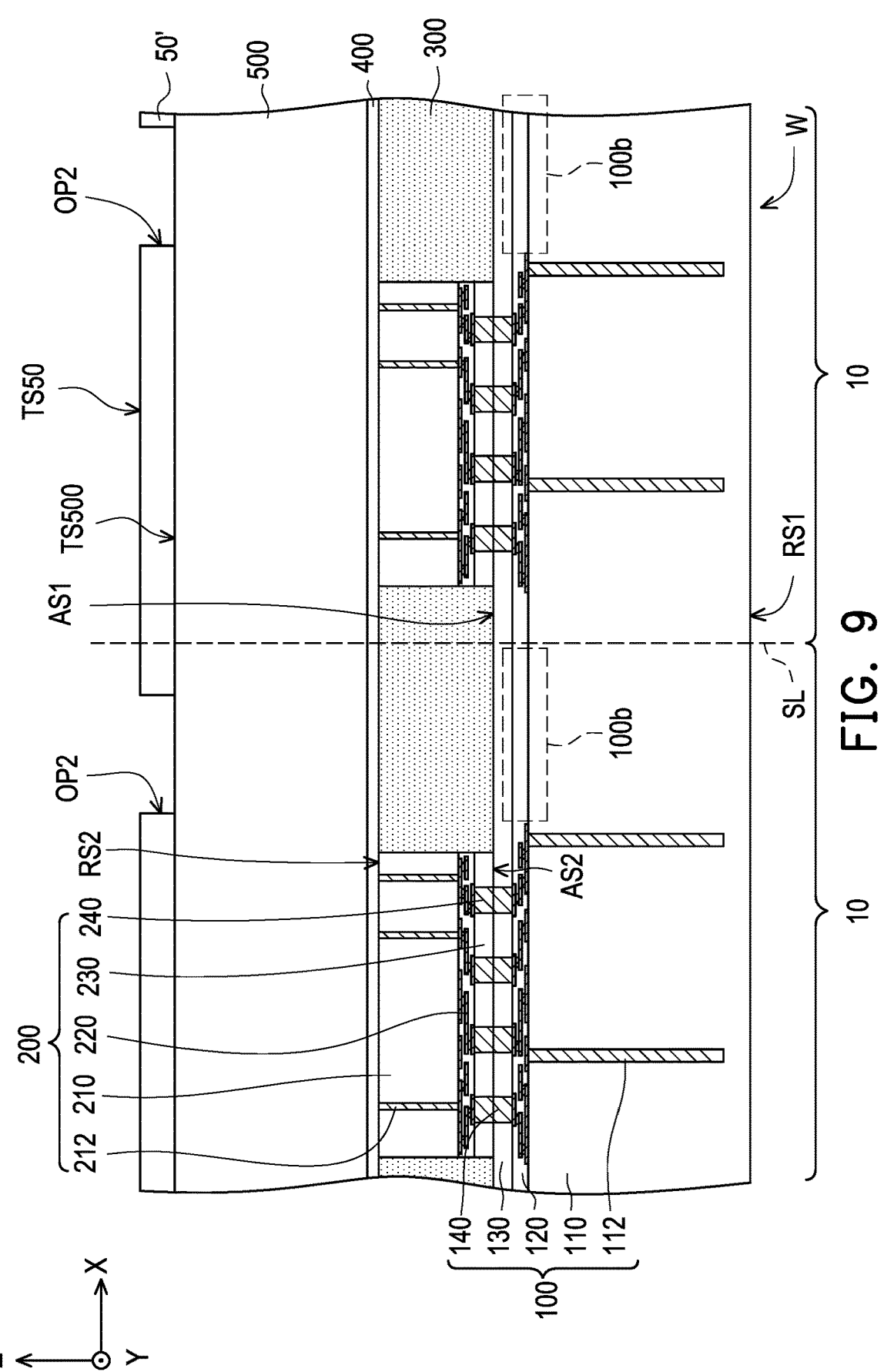

Referring to FIG. 9, in some embodiments, after forming the hard mask layer 50, the first photoresist layer PR1 is removed from the hard mask layer 50'. For example, the surface TS50 of the hard mask layer 50', which is referred to as an outermost surface or side of the hard mask layer 50', is completely revealed. The first photoresist layer PR1 may be removed by acceptable ashing process and/or photoresist stripping process, such as using an oxygen plasma or the like, and the disclosure is not limited thereto.

Figure 10:
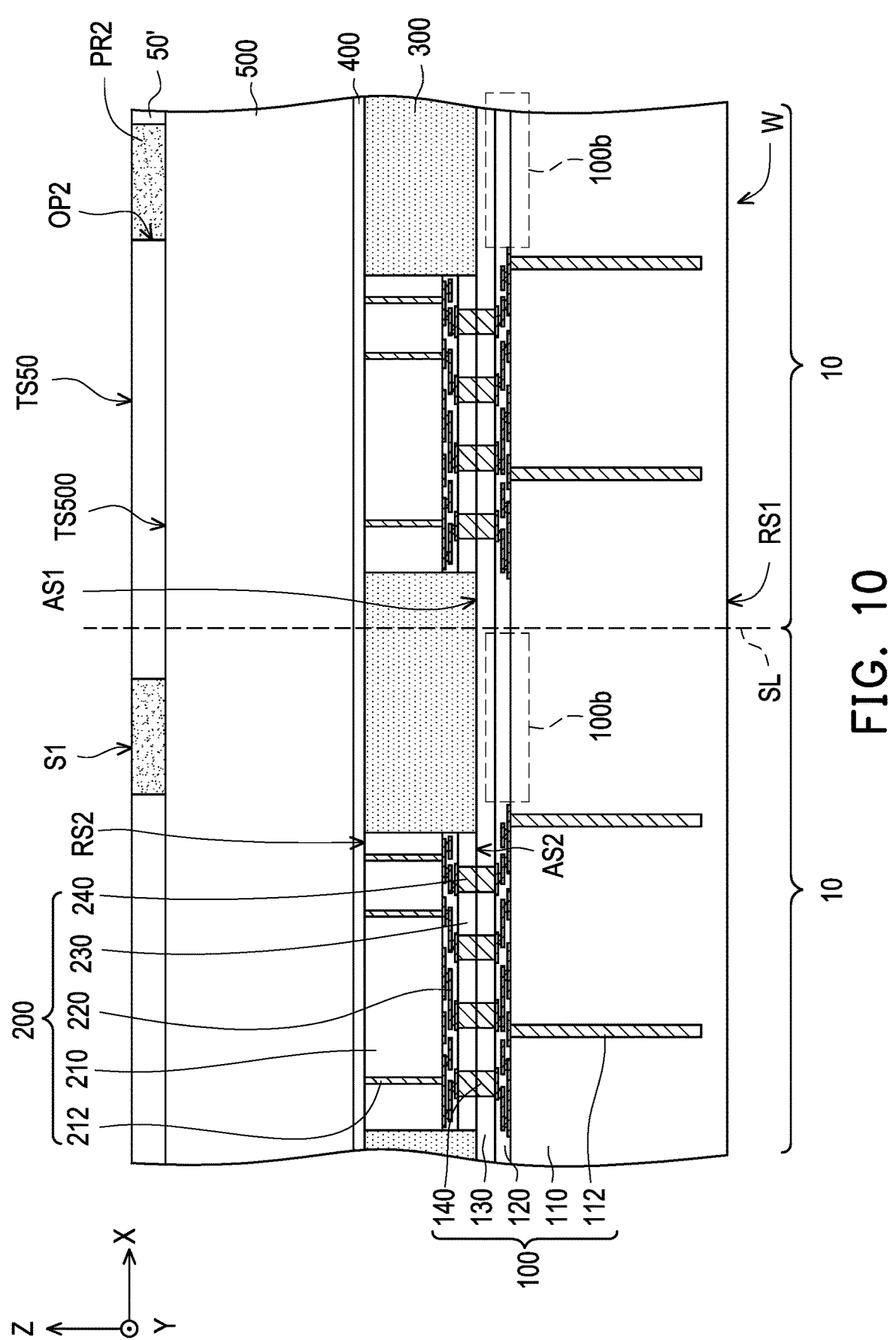

Referring to FIG. 10, in some embodiments, a second photoresist layer PR2 is formed in the openings OP2 formed in the hard mask layer 50'. For example, a surface S1 of the second photoresist layer PR2, which is referred to as an outermost surface or side of the second photoresist layer PR2, is substantially located at the same level where the surface TS50 of the hard mask layer 50' is located at. However, the disclosure is not limited thereto; the surface S1 of the second photoresist layer PR2 may be located above a level where the surface TS50 of the hard mask layer 50' being located at. Alternatively, the surface S1 of the second photoresist layer PR2 may be located below a level where the surface TS50 of the hard mask layer 50' being located at. The formation and material of the second photoresist layer PR2 may be similar to or substantially identical to the process and material of the first photoresist layer PR1 previously described in FIG. 7, and thus are not repeated herein for brevity. In the disclosure, the second photoresist layer PR2 may be referred to as a photo (or photosensitive) resist layer, a photo (or photosensitive) resist, or a resist layer.

Figure 11:
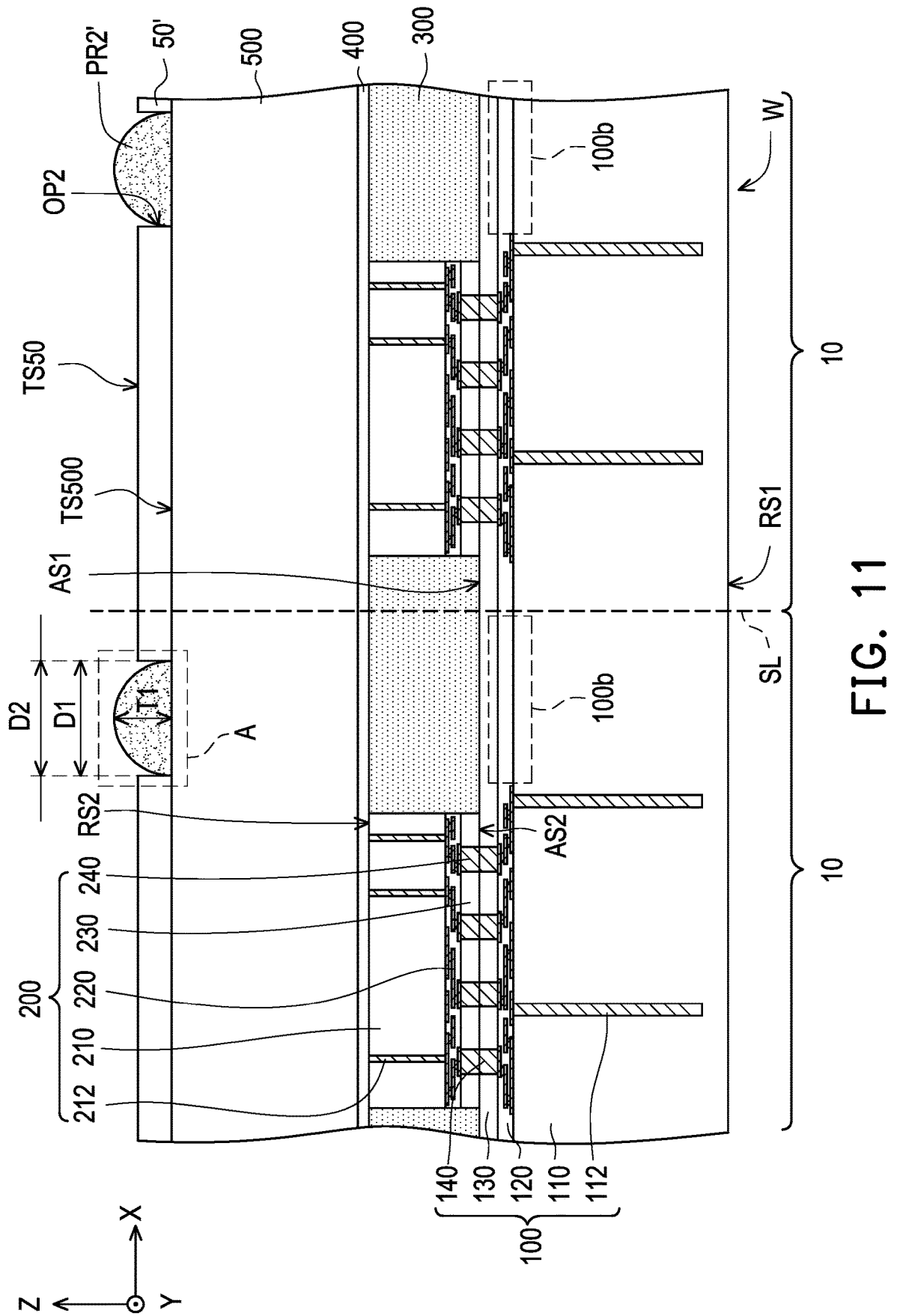
Figures 12A, 12B, 12C:
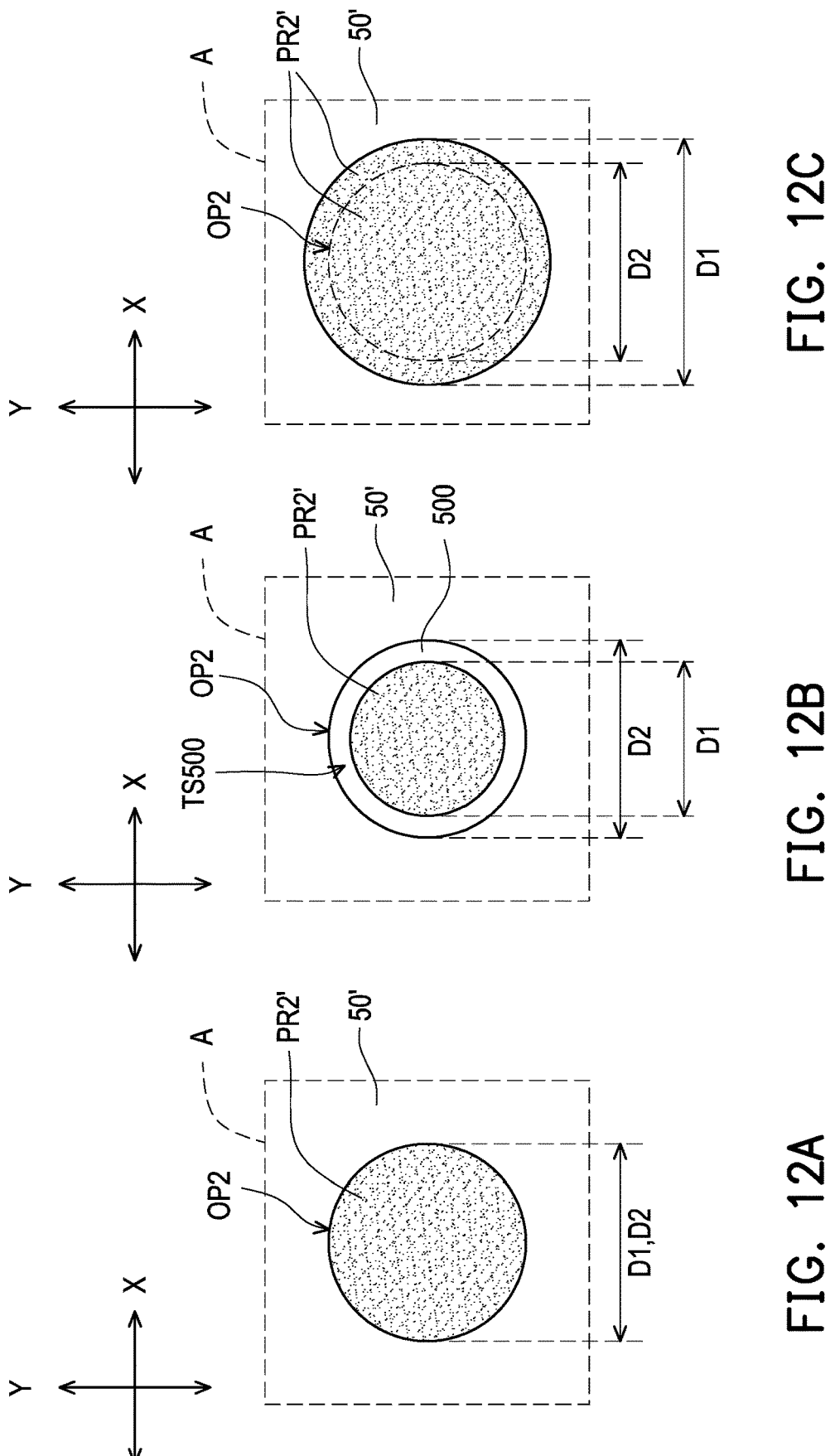

Referring to FIG. 11, in some embodiments, a reflow process is performed on the second photoresist layer PR2 to transform the second photoresist layer PR2 into a second photoresist layer PR2'. In some embodiments, the separated portions of the second photoresist layer PR2 located inside the openings OP2 formed in the hard mark layer 50' are reshaped during the reflow process to form a plurality of separated, hemispherical portions of the second photoresist layer PR2'. In the reflow process, the process temperature of the heat process may range from about 100° C. to about 200° C., and the process time of the heat process may range from about 3 minutes to about 5 minutes. For example, the reflow process is performed at about 160° C. for about 5 minutes. For example, a thickness T1 of each hemispherical portion of the second photoresist layer PR2' is greater than the thickness of the hard mask layer 50'. However, the disclosure is not limited thereto; the thickness T1 of each hemispherical portion of the second photoresist layer PR2' may be substantially equal to the thickness of the hard mask layer 50'. Alternatively, thickness T1 of each hemispherical portion of the second photoresist layer PR2' may be less than the thickness of the hard mask layer 50'. As shown in FIG. 11, positioning locations of the hemispherical portions of the second photoresist layer PR2' correspond to (e.g., overlap with) positioning locations of the optical input/output portions 100b of the photonic integrated circuit components 100 in the vertical projection on the photonic wafer W along the direction Z.

In some embodiments, in the top view, a horizontal size D1 of the hemispherical portions of the second photoresist layer PR2' is substantially equal to a horizontal size D2 of the openings OP2 formed in the hard mark layer 50', see FIG. 11 and FIG. 12A. For example, the edge of one hemispherical portion of the second photoresist layer PR2' is only in horizontal contact with a sidewall of a respective one opening OP2 formed in the hard mark layer 50'. That is, the hemispherical portions of the second photoresist layer PR2' are not overlapped with but in contact with the hard mask layer 50' in the vertical projection on the photonic wafer W along the direction Z.

In alternative embodiments, in the top view, a horizontal size D1 of the hemispherical portions of the second photoresist layer PR2' is less than as a horizontal size D2 of the openings OP2 formed in the hard mark layer 50', see FIG. 11 and FIG. 12B. For example, there is no physical contact between the edge of one hemispherical portion of the second photoresist layer PR2' and a sidewall of a respective one opening OP2 formed in the hard mark layer 50'. That is, the hemispherical portions of the second photoresist layer PR2' are not overlapped with and spacing apart from the hard mask layer 50' in the vertical projection on the photonic wafer W along the direction Z. For example, the surface TS500 of the supporting structure 500 is exposed by the hard mask layer 50' and the second photoresist layer PR2'. The supporting structure 500 being exposed is disposed between the hard mask layer 50' and the second photoresist layer PR2'.

In further alternative embodiments, in the top view, a horizontal size D1 of the hemispherical portions of the second photoresist layer PR2' is greater than as a horizontal size D2 of the openings OP2 formed in the hard mark layer 50', see FIG. 11 and FIG. 12C. For example, one hemispherical portion of the second photoresist layer PR2' is not only in horizontal contact with a respective one opening OP2 formed in the hard mark layer 50' but also in vertical contact with the respective one opening OP2 formed in the hard mark layer 50'. That is, the hemispherical portions of the second photoresist layer PR2' are overlapped with the hard mask layer 50' in the vertical projection on the photonic wafer W along the direction Z. For example, a portion of the hard mask layer 50' is disposed between the supporting structure 500 and the second photoresist layer PR2' in the direction Z.

Figure 13:
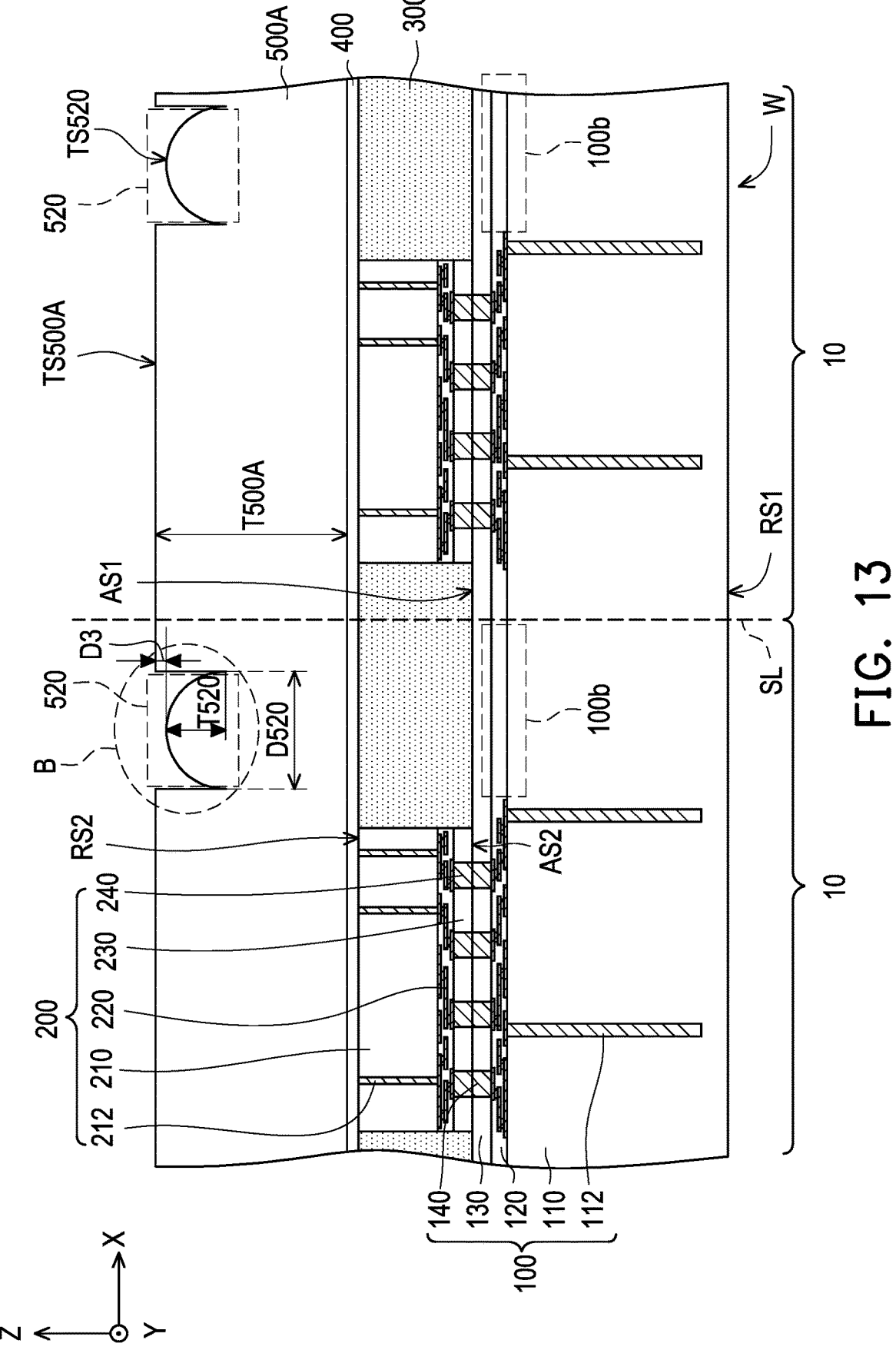

Referring to FIG. 11 and FIG. 13, in some embodiments, a patterning process is performed on the structure depicted in FIG. 11 to form a plurality of lens structures 520 in a supporting structure 500A. For example, the lens structures 520 are disposed inside the supporting structure 500A, where an outmost point of a surface TS520 is below a surface TS500A of the supporting structure 500A by a distance D3, as shown in FIG. 13. However, the disclosure is not limited thereto; the outmost point of the surface TS520 may be located at the same level where the surface TS500A of the supporting structure 500A being located at, e.g., the distance D3 is zero). Alternatively, the outmost point of the surface TS520 is above the surface TS500A of the supporting structure 500A by the distance D3. In some embodiments, the distance D3 is greater than or substantially equal to 0 μm and is less than or substantially equal to 1 μm. In some embodiments, the surfaces TS520 are referred to as outmost surfaces of the lens structure 520, and the surface TS500A is referred to as an outmost surface of the supporting structure 500A. In some embodiments, the lens structures 520 and the supporting structure 500A are integrally formed. Due to the lens structures 520 are at least partially placed inside the supporting structure 500A (e.g., below the surface TS500A), the supporting structure 500A can be referred to as a thick optical carrier.

In one package structure 10, the lens structures 520 formed in the supporting structure 500A may be arranged in array. For example, the lens structures 520 are arranged in the form of a matrix (such as a N"×N" array or a N"×M" array, where N", M">0, N" may or may not be equal to M") within at least one or each of photonic integrated circuit components 100 inside at least one or each of the package regions 10. The disclosure is not specifically limited as long as the lens structures 520 are capable of being optically coupled to the optical input/output portions 100b of the photonic integrated circuit components 100 in the photonic wafer W. In some embodiments, in the top view, the lens structures 520 are arranged into a line, such as a 1×5 array, as shown in FIG. 14A. In alternative embodiments, in the top view, the lens structures 520 arranged in immediately adjacent rows and/or columns are positioned in an alignment manner (e.g., an array form) on the X-Y plane, as shown in FIG. 14B. Alternatively, the lens structures 520 arranged in immediately adjacent rows and/or columns may be positioned in a staggered manner (e.g., a staggered form) on the X-Y plane, not shown. In further alternative embodiments, the lens structures 520 are arranged into a pre-determined pattern in a concentric manner, where the lens structures 520 are in a radial arrangement, as shown in FIG. 14C. The number of the lens structures 520 is limited to the drawings of the disclosure. Depending on the demand and design requirement, the number of the lens structures 520 may be one or more than one.

In some embodiments, positioning locations of the lens structures 520 correspond to (e.g., overlap with) positioning locations of the optical input/output portions 100b of the photonic integrated circuit components 100 in the vertical projection on the photonic wafer W along the direction Z. For example, the lens structures 520 are optically coupled to the optical input/output portions 100b of the photonic integrated circuit components 100 in the photonic wafer W. In some embodiments, a thickness T520 of the lens structures 520 ranges from about 4 μm to about 15 μm as measured along the direction Z, although other suitable thickness may alternatively be utilized. In some embodiments, a horizontal size D520 (referred to as a critical dimension (CD)) of the lens structures 520 ranges from about 50 μm to about 150 μm as measured along the direction X and/or the direction Y, although other suitable thickness may alternatively be utilized. In some embodiments, a radius of curvature (R) of the lens structures 520 ranges from about 50 μm to about 250 μm, although other suitable thickness may alternatively be utilized. The supporting structure 500A may have a thickness T500A of about 700 μm to about 900 μm as measured along the direction Z, although other suitable thickness may alternatively be utilized.

The patterning process may include an etching process, such as a dry etching. In some embodiments, the formation of the lens structures 520 includes, but not limited to, performing a dry etching on the structure depicted in FIG. 11 to simultaneously etch the hard mask layer 50', the second photoresist layer PR2' and the supporting structure 500 at different etching rates so to form the supporting structure 500A with the lens structures 520 embedded therein and remove the hard mask layer 50' and the second photoresist layer PR2' from the supporting structure 500A with the lens structures 520.

During the dry etching, the thickness T500A of the supporting structure 500A, which has a vertical projection not overlapping with vertical projections of lens structures 520 in the direction Z, can be controlled by adjusting an etching selectivity of the hard mask layer 50' with respect to an etching selectivity of the second photoresist layer PR2'. For one example, if considering the etching selectivity of the hard mask layer 50' is greater than the etching selectivity of the second photoresist layer PR2', the thickness T500A of the supporting structure 500A may be smaller. For another example, if considering the etching selectivity of the hard mask layer 50' is less than the etching selectivity of the second photoresist layer PR2', the thickness T500A of the supporting structure 500A may be greater. In the disclosure, the relationship between the etching rate of the second photoresist layer PR2' and the etching rate of the hard mask layer 50' are not specifically limited herein; and may be adjusted depending on the demand and design requirement of the supporting structure 500A. The etching rate of the second photoresist layer PR2' may be the same as the etching rate of the hard mask layer 50'. Alternatively, the etching rate of the second photoresist layer PR2' may be greater than the etching rate of the hard mask layer 50'. Or alternatively, the etching rate of the second photoresist layer PR2' may be less than the etching rate of the hard mask layer 50'.

On the other hand, the topography of the hemispherical portions of the second photoresist layer PR2' is adopted by the lens structures 520. With such, the radius of curvature (ROC) and the thickness T520 of the lens structures 520, which are also considered as the removal amount of the second photoresist layer PR2' and the supporting structure 500, can be controlled by adjusting the material type of the second photoresist layer PR2', the thickness of the hemispherical portions of the second photoresist layer PR2', and the type of an etchant(s) in the drying etching (e.g., the etching selectivities of the second photoresist layer PR2' and the supporting structure 500). In the disclosure, the relationship between the etching rate of the second photoresist layer PR2' and the etching rate of the supporting structure 500 are not specifically limited herein; and may be adjusted depending on the demand and design requirement of the lens structures 520. The etching rate of the second photoresist layer PR2' may be the same as the etching rate of the supporting structure 500. Alternatively, the etching rate of the second photoresist layer PR2' may be greater than the etching rate of the supporting structure 500. Or alternatively, the etching rate of the second photoresist layer PR2' may be less than the etching rate of the supporting structure 500.

Additionally, in the disclosure, the relationship between the etching rate of the hard mask layer 50' and the etching rate of the supporting structure 500 are not specifically limited herein. The etching rate of the hard mask layer 50' may be the same as the etching rate of the supporting structure 500. Alternatively, the etching rate of the hard mask layer 50' may be greater than the etching rate of the supporting structure 500. Or alternatively, the etching rate of the hard mask layer 50' may be less than the etching rate of the supporting structure 500. Owing to the forming processes (e.g., material type, photolithography and reflowing) of the second photoresist layer PR2/PR2', the within-a-die (WiD) CD uniformity, the radius of curvature (ROC) and the thickness uniformity of the second photoresist layer PR2/PR2' can be well-controlled, so that the desired radius of curvature (ROC; also often denoted as "R"), the desired CD and the desired thickness of the lens structures 520 can be easily obtained and controlled by a proper patterning process as mentioned above; thereby improving the uniformities of the radius of curvature (ROC), the WiD critical dimension and the thickness of the lens structures 520.

The surface TS520 of one lens structure 520 and a vertical surface S2 of the supporting structure 500A corresponding thereto may constitute a recess R formed in the supporting structure 500A exposing the lens structure 520. In some embodiments, if considering the second photoresist layer PR2' only being in horizontal contact the hard mask layer 50' (in FIG. 12A), the surface TS520 of the lens structure 520 is directly connected to the vertical surface S2 of the supporting structure 500A, see FIG. 15A. In such embodiments, the surface TS520 may be referred to as a bottom surface of the recess R, and the vertical surface S2 may be referred to as a sidewall of the recess R.

In alternative embodiments, if considering the second photoresist layer PR2' being spacing apart from the hard mask layer 50' (in FIG. 12B), the surface TS520 of the lens structure 520 is connected to the vertical surface S2 of the supporting structure 500A through a surface of an extended portion 502, see FIG. 15B. In such alternative embodiments, the surface TS520 and the surface of the extended portion 502 may be together referred to as a bottom surface of the recess R, and the vertical surface S2 may be referred to as a sidewall of the recess R. The extended portion 502 is part of the supporting structure 500A, for example.

In further alternative embodiments, if considering the second photoresist layer PR2' being overlapped with the hard mask layer 50' (in FIG. 12C), the surface TS520 of the lens structure 520 is directly connected to the vertical surface S2 of the supporting structure 500A, and an extended portion 504 is disposed on the surface TS500A having a sidewall aligned with the vertical surface S2, see FIG. 15C. In such yet alternative embodiments, the surface TS520 may be referred to as a bottom surface of the recess R, and the vertical surface S2 may be referred to as a sidewall of the recess R. The extended portion 504 is part of the supporting structure 500A, for example.

Figure 16:
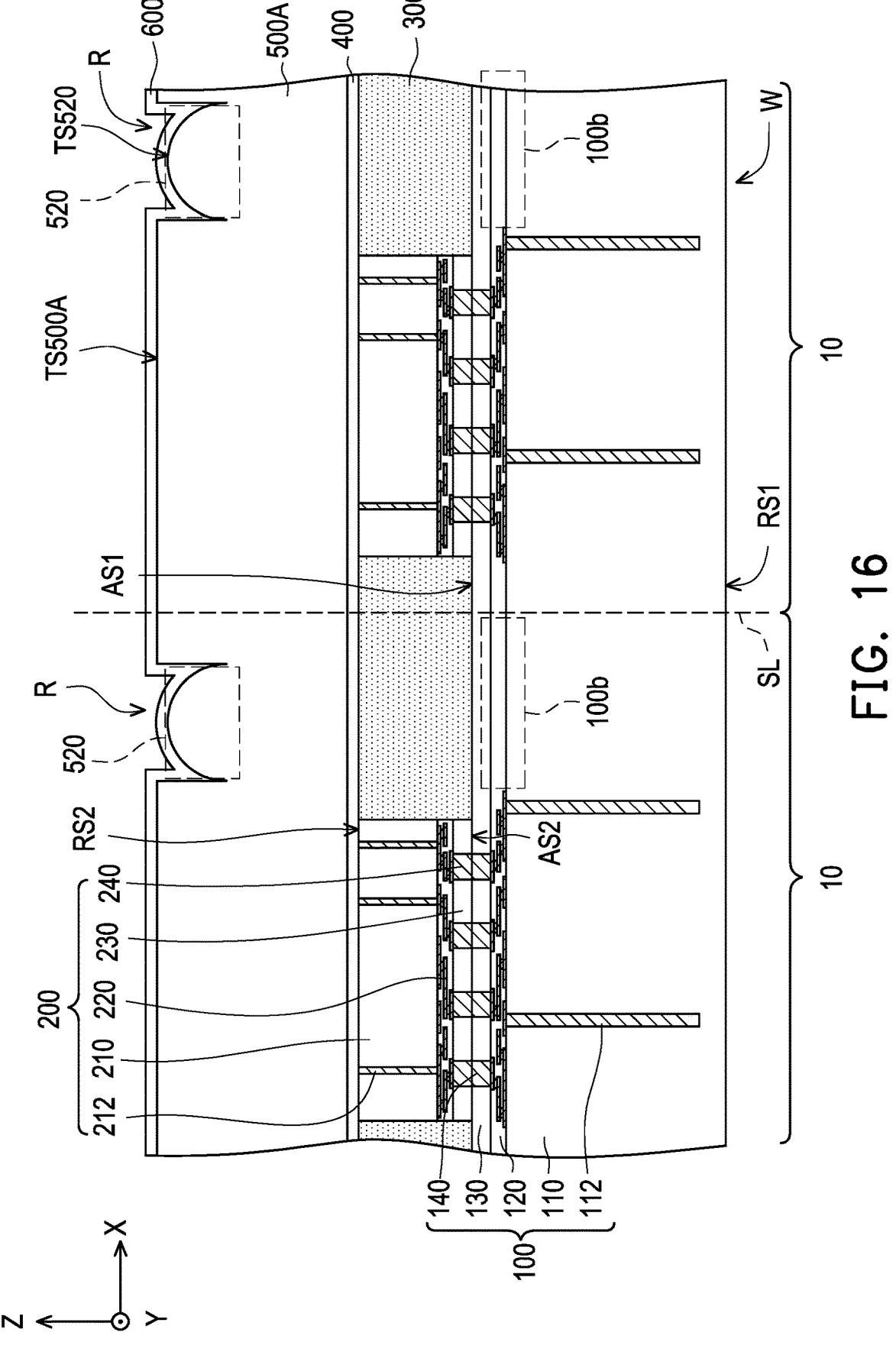

Referring to FIG. 16, in some embodiments, an ARC layer 600 is conformally formed over the lens structures 520 and the supporting structure 500A. For example, the ARC layer 600 is disposed on and in physical contact with the surfaces TS520 of the lens structures 520 and the surface TS500A of the supporting structure 500A. In the case, the ARC layer 600 extends into the recesses R formed in the supporting structure 500A to line the sidewall and bottom surface of the recesses R. The ARC layer 600 may be made of a dielectric material, and may be formed by any suitable method, such as CVD or ALD. A material of the ARC layer 600 may include silicon oxide such as SiO or SiO₂, silicon nitride, silicon oxynitride, or combinations thereof. For example, the ARC layer 600 includes a conformal layer of silicon nitride. The material of the ARC layer 600 is substantially the same to the material of the ARC layer 400, in one embodiment. Alternatively, the material of the ARC layer 600 may be different from the material of the ARC layer 400. The ARC layer 600 may have a thickness of about 300 nm to about 900 nm as measured along the direction Z, although other suitable thickness may alternatively be utilized. The thickness of the ARC layer 600 is substantially the same to the thickness of the ARC layer 400, in one embodiment. Alternatively, the thickness of the ARC layer 600 may be different from the thickness of the ARC layer 400. The disclosure is not limited thereto. The ARC layer 600 may be referred to as an optical layer or film, or an anti-reflection layer or film.

Figure 17:
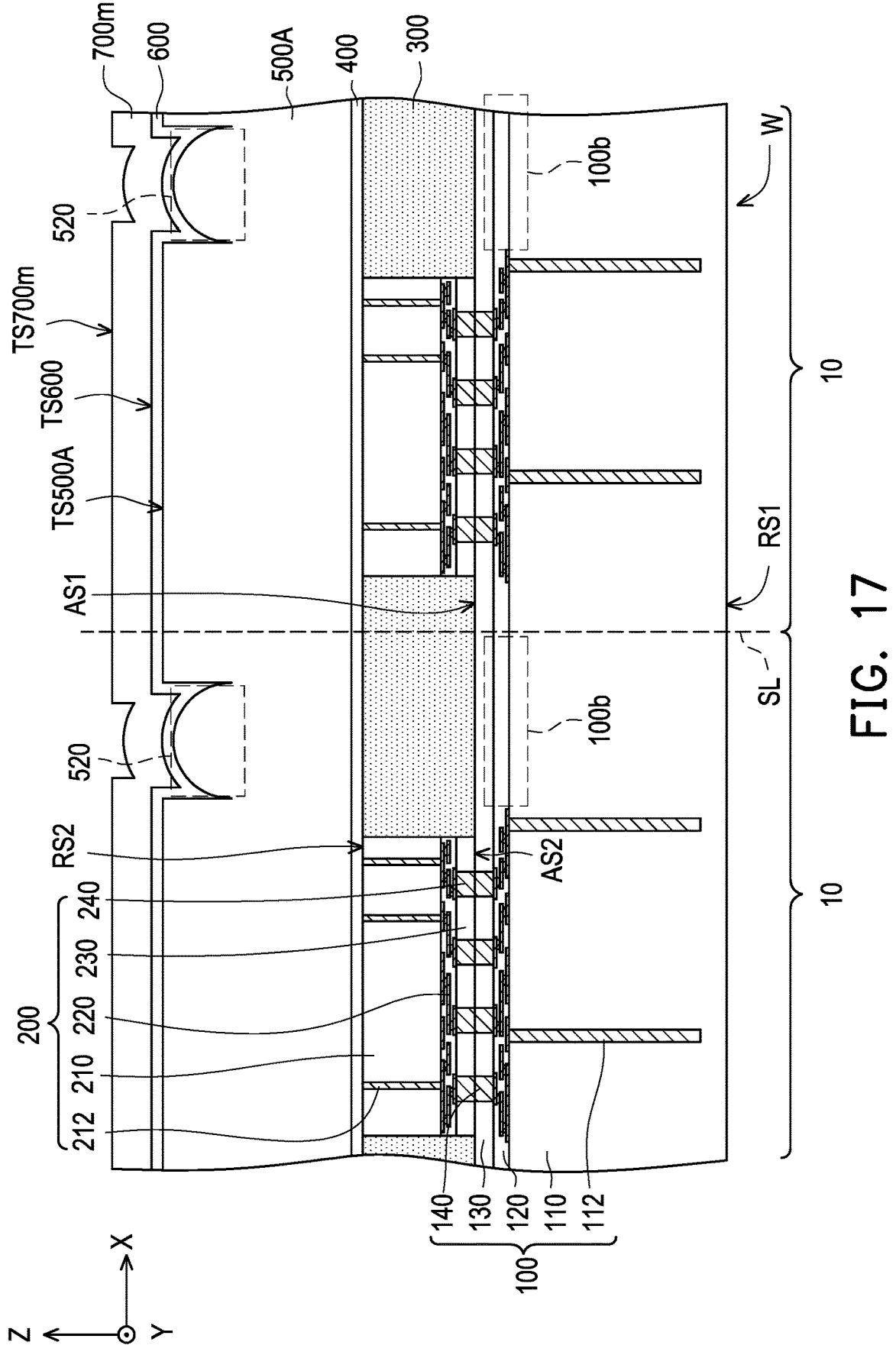

Referring to FIG. 17, in some embodiments, a dielectric material 700m is formed over the ARC layer 600. For example, the dielectric material 700m is disposed on and in physical contact with the surface TS600 of the ARC layer 600. In the case, the dielectric material 700m fills up the recesses R. In some embodiments, the dielectric material 700m is conformally formed over the over the ARC layer 600 by spin-coating, deposition such as CVD, physical vapor deposition (PVD), or the like. In some embodiments, a material of the dielectric material 700m may include a nitride (such as silicon nitride), an oxide (such as silicon oxide) or the like (such as, silicon oxynitride, silicon carbide, a polymer, the like); the disclosure is not limited thereto as long as the material of the dielectric material 700m is optically transparent to the optical signal to be processed by the optical input/output portions 100b of the photonic integrated circuit components 100. For example, a surface TS700m of the dielectric material 700m is above the recesses R, as shown in FIG. 17.

Figure 18:
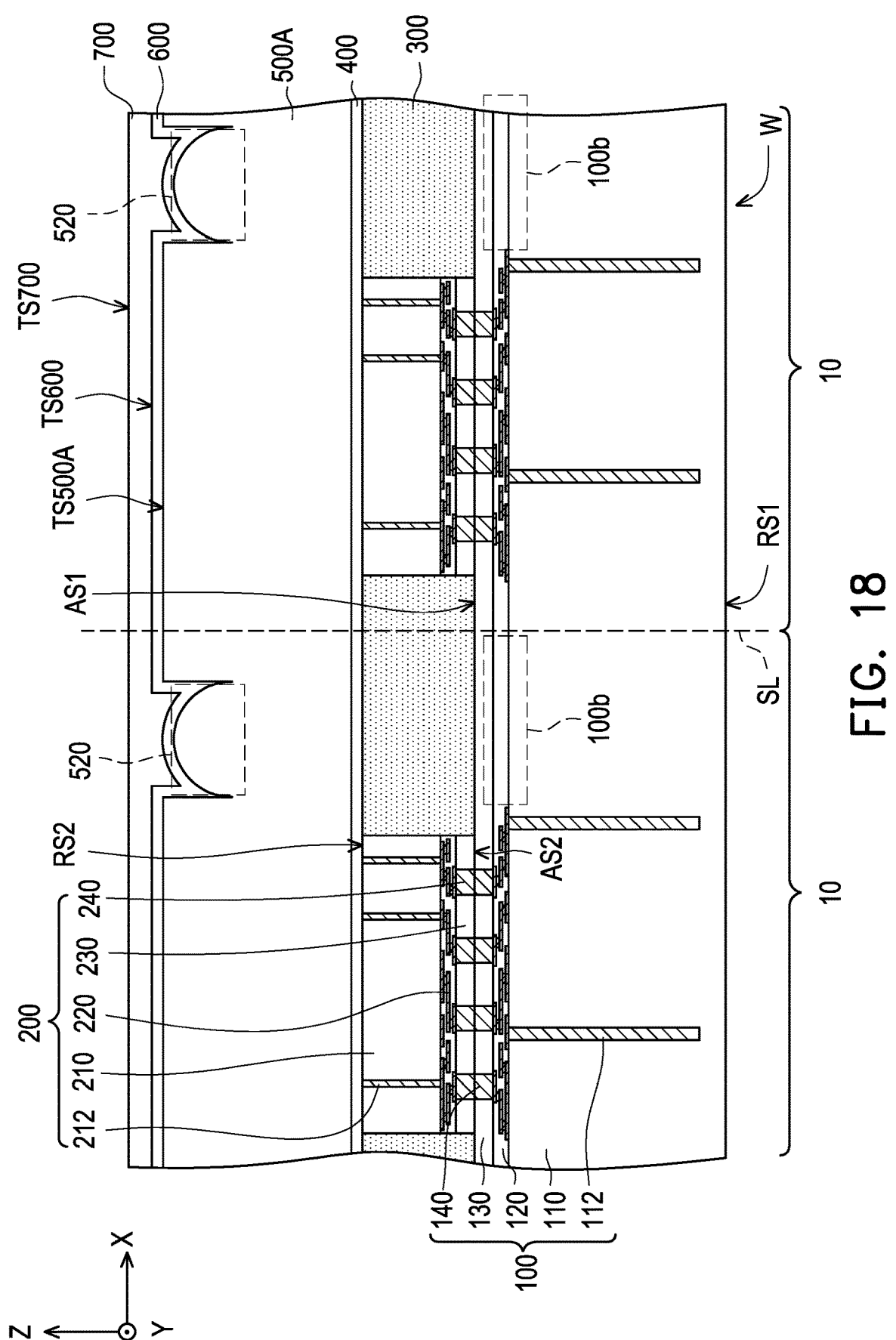

Referring to FIG. 18, in some embodiments, a grinding or polishing process is performed on the dielectric material 700m to form a dielectric layer 700 over the ARC layer 600. For example, in the grinding or polishing process, the dielectric material 700m is partially removed until the dielectric material 700m is planarized to form the dielectric layer 700 having a surface TS700, where the surface TS700 is planarized and flat. The dielectric material 700m may be partially removed by a CMP process, a mechanical grinding process, an etching process, a combination thereof, or other suitable removal processes. After performing the grinding or polishing process, the ARC layer 600, the supporting structure 500A, and the lens structure 520 are still covered by the dielectric layer 700, as shown in FIG. 18, for example. The dielectric layer 700 is capable of providing protection to the lens structures 520 and the ARC layer 600 disposed underneath thereto, in the disclosure. The dielectric layer 700 may be referred to as a protection layer or a protection film. After the grinding or polishing process, a cleaning step may be optionally performed, for example to clean and remove the residue generated from the grinding or polishing process. However, the disclosure is not limited thereto, and the grinding or polishing process may be performed through any other suitable method.

Figure 19:
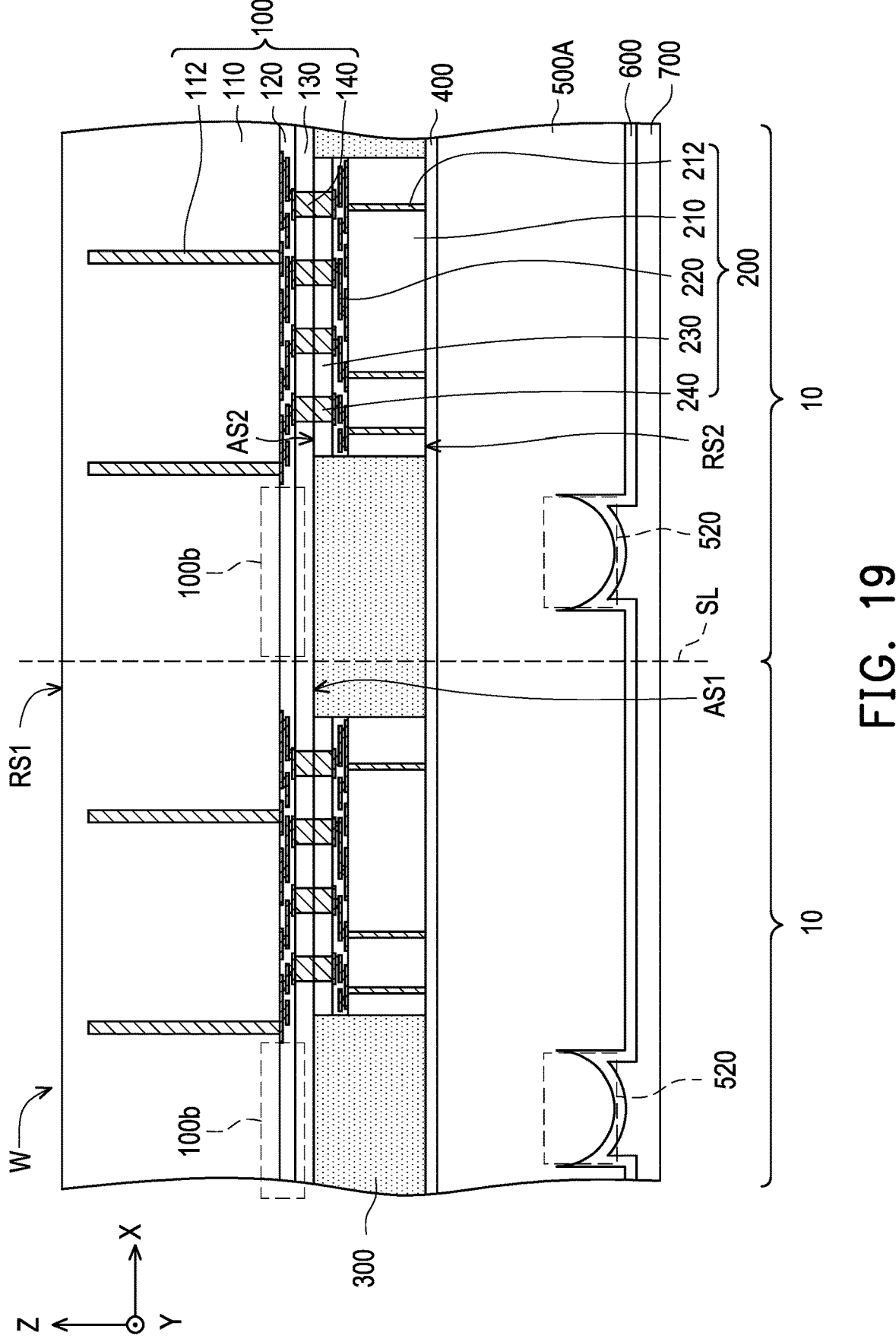

Referring to FIG. 19, in some embodiments, the whole structure depicted in FIG. 18 is flipped (turned upside down). For example, the dielectric layer 700 is flipped and then placed onto an additional holding device (not shown), where the additional holding device holds and supports the structure during sequent processes to avoid any undesired damages to the structure. In some embodiments, the additional holding device may be an adhesive tape, a carrier film or a suction pad being supported by a frame.

If the temporary carrier is adopted for holding the photonic wafer W previously described in FIG. 1, the temporary carrier is separated from the photonic wafer W. In the embodiments of which the temporary carrier including the wafer-level carrier with the debond layer coated thereon, the wafer-level carrier is detached from the photonic wafer W through a debonding process (such as a laser debonding process or like), where the wafer-level carrier and the debond layer are debonded and then removed. In some embodiments, the first rear surface RS1 of the photonic wafer W is exposed and facing upward, as show in FIG. 19. During the debonding step, the additional holding device is used to secure the structure depicted in FIG. 18 before debonding the wafer-level carrier and the debond layer.

Figure 20:
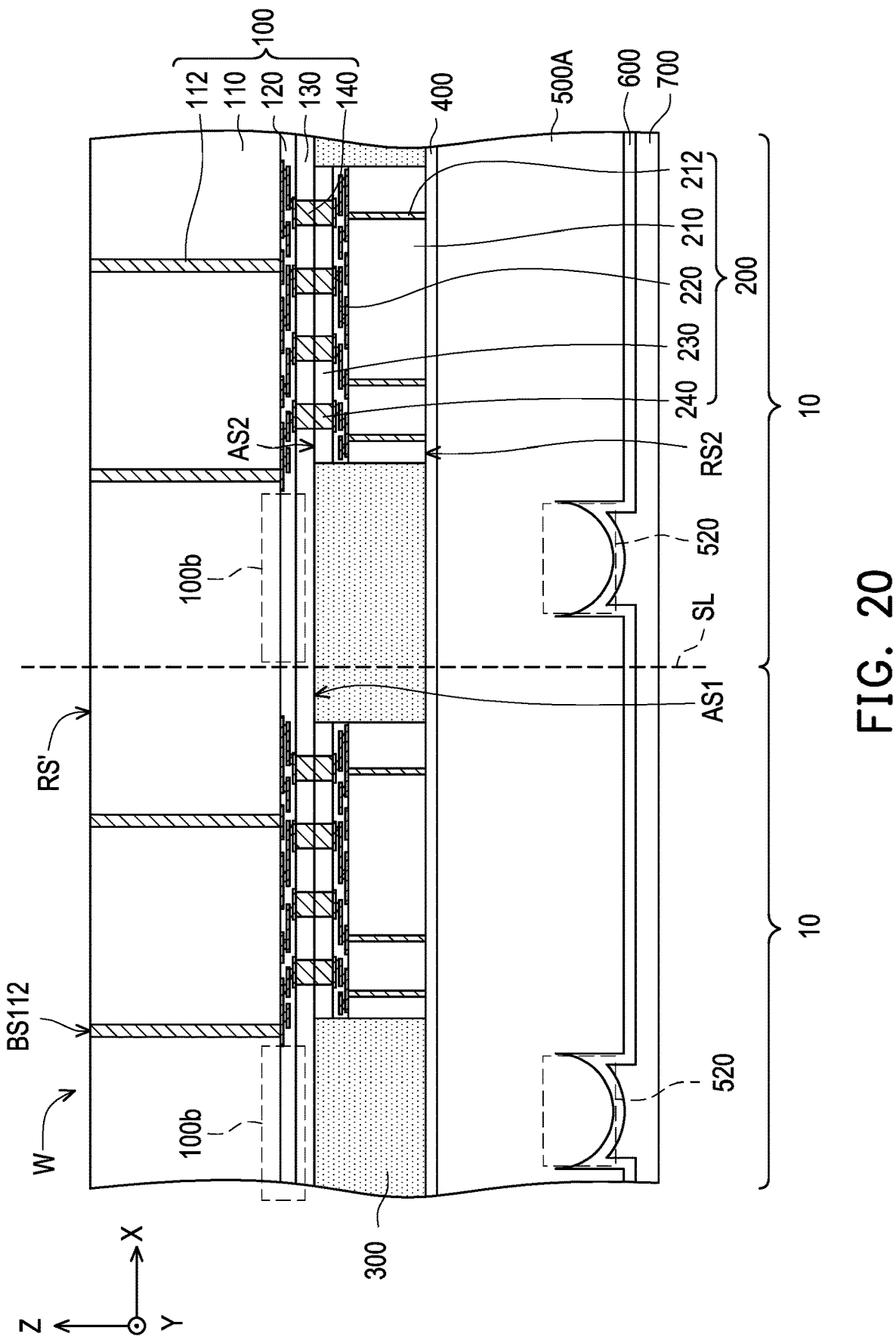

Referring to FIG. 20, in some embodiments, a planarizing process is performed to expose the first TSVs 112 from the photonic wafer W. For example, a portion of the first semiconductor substrate 110 is removed to obtain a bottom surface RS1' exposing the first TSVs 112. In some embodiments, bottom surface BS112 of the first TSVs 112 are substantially levelled with the bottom surface RS1' of the first semiconductor substrate 110. For example, the bottom surface BS112 of the first TSVs 112 are substantially coplanar to the bottom surface RS1' of the first semiconductor substrate 110. In the embodiments of which the liners and/or the dielectric liners are presented (as discussed in FIG. 1), the liners and/or the dielectric liners are also exposed by the bottom surface RS1' exposing the first TSVs 112.

During the planarizing process, the first TSVs 112 may also be partially removed. In some embodiments, the planarizing process may include a grinding process, a CMP process, an etching process, or a combination thereof. The etching process may include a dry etching, a wet etching, or a combination thereof. After the planarizing process, a cleaning process may be optionally performed, for example to clean and remove the residue generated from the planarizing process. However, the disclosure is not limited thereto, and the planarizing process may be performed through any other suitable method.

Figure 21:
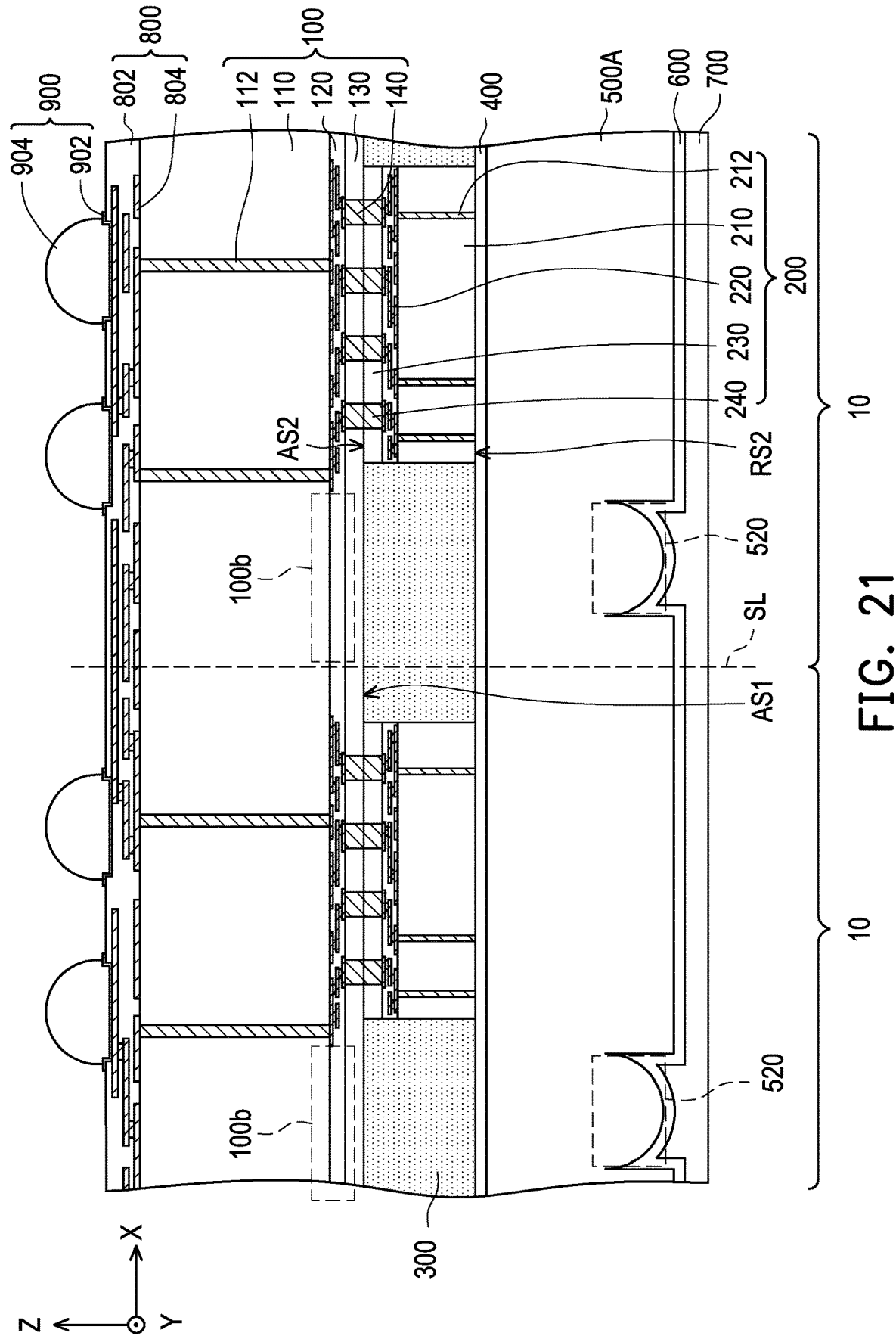

Referring to FIG. 21, in some embodiments, a redistribution circuit structure 800 is formed over the first rear surface RS1' of the photonic wafer W. In some embodiments, the redistribution circuit structure 800 includes a plurality of inter-dielectric layers 802 and a plurality of redistribution conductive layers 804 stacked alternately. For example, the redistribution conductive layers 804 are electrically connected to the first TSVs 112. As shown in FIG. 21, in some embodiments, the surfaces BS112 of the first TSVs 112 is in contact with a bottommost layer of the redistribution conductive layers 804. In some embodiments, the topmost redistribution conductive layer 804 is exposed by a topmost layer (e.g., openings formed therein) of the inter-dielectric layers 802 for electrically connecting to one or more connectors above.

Here, the afore-said overlying connectors may be later-formed connectors, such as conductive terminals or the like. The formation and material of the inter-dielectric layers 802 may be similar to or substantially identical to the processes and materials of the inter-dielectric layers of the first interconnection structure 120, and the formation and material of the redistribution conductive layers 804 may be similar to or substantially identical to the processes and materials of the patterned conductive layers of the first interconnection structure 120, and thus are not repeated herein for brevity. The numbers of the layers of the inter-dielectric layers 802 and the redistribution conductive layers 804 may be may be designated based on the demand and/or design layout, and is not specifically limited to the disclosure. The redistribution conductive layers 804 may be referred to as patterned conductive layers, redistribution layers, redistribution wires, routing layers, or routing wires.

Thereafter, a plurality of conductive elements 900 may be formed on the redistribution circuit structure 800, as shown in FIG. 21. The conductive elements 900 each include an under-ball metallurgy (UBM) pattern 902 and a conductive terminal 904 located over and connected to the UBM pattern 902, for example. In some embodiments, the conductive terminals 904 are electrically connected to the redistribution circuit structure 800 through the UBM patterns 902. For example, the conductive elements 900 are connected to the topmost redistribution conductive layer 804 exposed by the topmost inter-dielectric layer 802. That is, in some embodiments, the conductive elements 900 are electrically connected to the redistribution circuit structure 800, and are electrically connected to the first TSVs 112 through the redistribution circuit structure 800. In some embodiments, some of the conductive elements 900 are electrically connected to the photonic integrated circuit components 100 through the redistribution circuit structure 800 and the first TSVs 112. In some embodiments, some of the conductive elements 900 are electrically connected to the electric integrated circuit components 200 through the redistribution circuit structure 800, the first TSVs 112, and the photonic integrated circuit components 100.

The UBM patterns 902 may be a metal layer, which may include a single layer or a composite layer comprising a plurality of sub-layers formed of different materials. In some embodiments, the materials of the UBM patterns 902 includes copper, nickel, titanium, molybdenum, tungsten, titanium nitride, titanium tungsten, or alloys thereof or the like, and may be formed by an electroplating process, for example. The UBM patterns 902 each may include titanium layer and a copper layer over the titanium layer. In some embodiments, the UBM patterns 902 are formed using, for example, sputtering, PVD, or the like. The shape and number of the UBM patterns 902 are not limited in this disclosure. The number of the UBM patterns 902 may be controlled by adjusting the numbers of portions of the topmost redistribution conductive layer 804 being exposed by the topmost inter-dielectric layer 802. The UBM patterns 902 may be omitted.

In a further alternative embodiment, besides the formation of the UBM patterns 902, additional conductive pads (not shown) are also formed for mounting semiconductor passive components/devices (not shown) thereon. The semiconductor passive components/devices may be integrated passive devices (IPDs) or surface mount devices (SMDs). The materials of the conductive pads and the UBM patterns 902 may be the same. Alternatively, the material of the UBM patterns 902 may be different from the material of the conductive pads. The disclosure is not limited thereto.

In some embodiments, the conductive terminals 904 are disposed on the UBM patterns 902 by ball placement process or reflow process. The conductive terminals 904 may be micro-bumps, metal pillars, electroless nickel-electroless palladium-immersion gold (ENEPIG) formed bumps, controlled collapse chip connection (C4) bumps (for example, which may have, but not limited to, a size of about 80 μm), a ball grid array (BGA) bumps or balls (for example, which may have, but not limited to, a size of about 400 μm), solder balls, or the like. The disclosure is not limited thereto. The numbers of the conductive terminals 904 may correspond to the numbers of the UBM patterns 902. When solder is used, the solder may include either eutectic solder or non-eutectic solder. The solder may include lead or be lead-free, and may include Sn—Ag, Sn—Cu, Sn—Ag—Cu, or the like. The conductive terminals 904 may be referred to as conductive input/output terminals of a semiconductor package structure (e.g., the semiconductor structure 10A).

Figure 22:
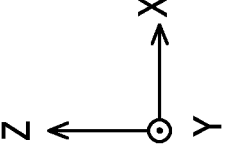

Referring to FIG. 22, in some embodiments, a dicing (or singulation) process is sequentially performed to cut through the whole structure depicted in FIG. 21 (including package structures 10 interconnected to each other) into individual and separated package structures 10. In one embodiment, the singulation process is a wafer dicing process including mechanical blade sawing or laser cutting. The disclosure is not limited thereto. Up to here, the package structure 10 is manufactured. Only one package structure 10 is shown in FIG. 22 for illustrative purposes and simplicity.

As shown in FIG. 22, the package structure 10 include the photonic integrated circuit component 100, the electric integrated circuit component 200, the insulating encapsulation 300, the ARC layer 400, the supporting structure 500A having lens structure 520 formed therein, the ARC layer 600, the dielectric layer 700, the redistribution circuit structure 800, and the conductive elements 900, in some embodiments. For example, the electric integrated circuit component 200 is stacked on and electrically connected to the photonic integrated circuit component 100, without overlapping the optical input/output portion 100b of the photonic integrated circuit component 100. As shown in FIG. 22, the insulating encapsulation 300 may laterally encapsulate the electric integrated circuit component 200 and cover the photonic integrated circuit component 100 exposed by the electric integrated circuit component 200. In some embodiments, the supporting structure 500A with at least one lens structures 520 formed therein is disposed on the insulating encapsulation 300 and the electric integrated circuit component 200, where the at least one lens structures 520 is optically connected to the optical input/output portion 100b of the photonic integrated circuit component 100. For example, the insulating encapsulation 300 and the electric integrated circuit component 200 are disposed between the supporting structure 500A and the photonic integrated circuit component 100.

As shown in FIG. 22, the dielectric layer 700 serving as a protection layer or film may be disposed on and completely covers the at least one lens structures 520 and the supporting structure 500A. In some embodiments, the ARC layer 400 is sandwiched between the supporting structure 500A and the insulating encapsulation 300, between the at least one lens structures 520 and the insulating encapsulation 300, and between the supporting structure 500A and the electric integrated circuit component 200. In some embodiments, the ARC layer 600 is sandwiched between the supporting structure 500A and the dielectric layer 700 and between the at least one lens structures 520 and dielectric layer 700. As shown in FIG. 22, the redistribution circuit structure 800 may be disposed on and electrically connected to the photonic integrated circuit component 100, and the conductive elements 900 are disposed on and electrically connected to the redistribution circuit structure 800. For example, the redistribution circuit structure 800 is sandwiched between the photonic integrated circuit component 100 and the conductive elements 900.

In some embodiments, a sidewall SW700 of the dielectric layer 700, a sidewall SW600 of the ARC layer 600, a sidewall SW500A of the supporting structure 500A, a sidewall SW400 of the ARC layer 400, a sidewall SW300 of the insulating encapsulation 300, a sidewall SW100 of the photonic integrated circuit component 100, and a sidewall SW800 of the redistribution circuit structure 800 are substantially aligned to each other, as shown in FIG. 22. In the case, the sidewall SW700 of the dielectric layer 700, the sidewall SW600 of the ARC layer 600, the sidewall SW500A of the supporting structure 500A, the sidewall SW400 of the ARC layer 400, the sidewall SW300 of the insulating encapsulation 300, the sidewall SW100 of the photonic integrated circuit component 100, and the sidewall SW800 of the redistribution circuit structure 800 together constitute a sidewall of the package structure 10. In the package structure 10, for example, on the top view (e.g., the X-Y plane) in direction Z, a projection area of the electric integrated circuit component 200 is located within a projection area of the photonic integrated circuit component 100, and a projection area of the at least one lens structure 520 is located within the projection area of the photonic integrated circuit component 100 next to the projection area of the electric integrated circuit component 200. With such, the at least one lens structure 520 is optically coupled to the optical input/output portions 100b of the photonic integrated circuit component 100.

Figure 23:
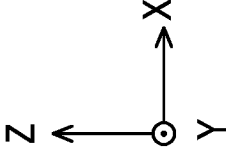
FIG. 23 is a schematic cross-sectional view of a package structure in accordance with some embodiments of the disclosure.

Alternatively, the redistribution circuit structure 800 may be omitted. FIG. 23 is a schematic cross-sectional view of a package structure 20 in accordance with some embodiments of the disclosure. The elements similar to or substantially the same as the elements described above will use the same reference numbers, and certain details or descriptions of the same elements (e.g., the formations and materials) and the relationship thereof (e.g., the relative positioning configuration and electrical connection) will not be repeated herein. Referring to FIG. 22 and FIG. 23 together, the semiconductor structure 10 depicted in FIG. 22 and the semiconductor structure 20 depicted in FIG. 23 are similar; the difference is that, the semiconductor structure 20 excludes the redistribution circuit structure 800. In such embodiment of the semiconductor structure 20, electrical connection among the first TSVs 112 of the photonic integrated circuit component 200 and the conductive elements 900 are achieved via a direct contact, e.g., the first TSVs 112 is physically connected to the conductive elements 900. In addition, as shown in FIG. 23, a dielectric layer 906 with a plurality of openings (not labelled) may be optionally formed on the first rear surface RS1' of the photonic integrated circuit component 100, where the plurality of openings exposes the surfaces BS112 of the first TSVs 112 of the photonic integrated circuit component 200 for electrical connection to any other external component(s), e.g., conductive elements 900. The formation and material of the dielectric layer 906 may be similar to or substantially identical to the process and material of the inter-dielectric layers of the first interconnection structure 120, the second interconnection structure 220, and/or the redistribution circuit structure 800; and thus, are not repeated herein.

In some embodiments, a sidewall SW700 of the dielectric layer 700, a sidewall SW600 of the ARC layer 600, a sidewall SW500A of the supporting structure 500A, a sidewall SW400 of the ARC layer 400, a sidewall SW300 of the insulating encapsulation 300, a sidewall SW100 of the photonic integrated circuit component 100, and a sidewall SW906 of the dielectric layer 906 are substantially aligned to each other, as shown in FIG. 23. In the case, the sidewall SW700 of the dielectric layer 700, the sidewall SW600 of the ARC layer 600, the sidewall SW500A of the supporting structure 500A, the sidewall SW400 of the ARC layer 400, the sidewall SW300 of the insulating encapsulation 300, the sidewall SW100 of the photonic integrated circuit component 100, and the sidewall SW906 of the dielectric layer 906 together constitute a sidewall of the package structure 10. In the package structure 20, for example or example, on the top view (e.g., the X-Y plane) in direction Z, a projection area of the electric integrated circuit component 200 is located within a projection area of the photonic integrated circuit component 100, and a projection area of the at least one lens structure 520 is located within the projection area of the photonic integrated circuit component 100 next to the projection area of the electric integrated circuit component 200. With such, the at least one lens structure 520 is optically coupled to the optical input/output portions 100*b* of the photonic integrated circuit component 100.

FIG. 24 through FIG. 30 are schematic cross-sectional views or top views of various stages in a manufacturing method of a package structure in accordance with some embodiments of the disclosure. FIG. 31 is a schematic cross-sectional view of a package structure in accordance with some embodiments of the disclosure. The elements similar to or substantially the same as the elements described above will use the same reference numbers, and certain details or descriptions of the same elements (e.g., the formations and materials) and the relationship thereof (e.g., the relative positioning configuration and electrical connection) will not be repeated herein.

Figure 24:
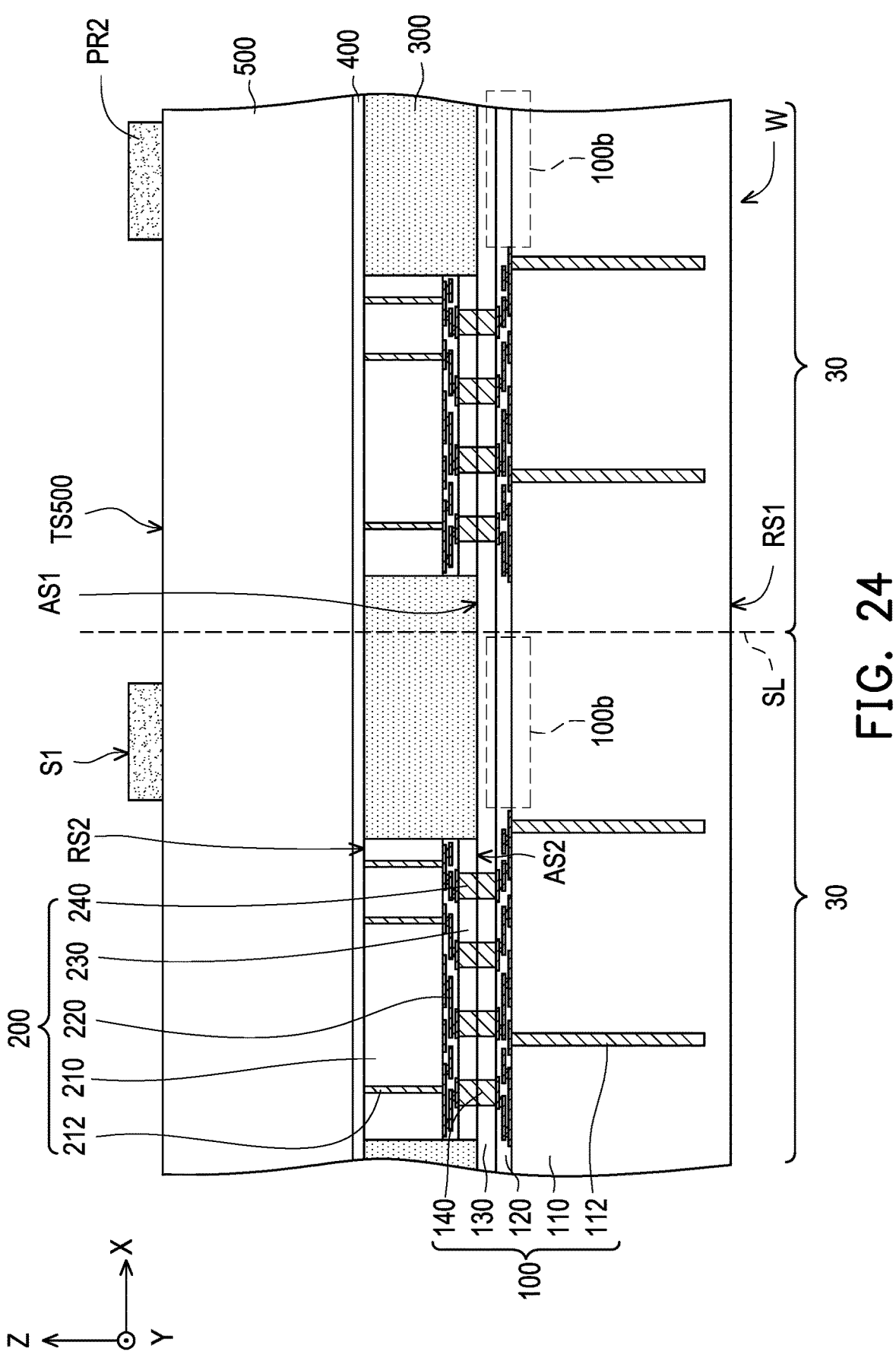
FIG. 24 through FIG. 30 are schematic cross-sectional views or top views of various stages in a manufacturing method of a package structure in accordance with some embodiments of the disclosure.

Referring to FIG. 24, in some embodiments, a second photoresist layer PR2 is formed on the supporting structure 500, following the process as described in FIG. 5. For example, the second photoresist layer PR3 is disposed on and in physical contact with the surface TS500 of the supporting structure 500. The details of the second photoresist layer PR2 have been discussed in FIG. 10, and thus are not repeated herein for brevity. In some embodiments, the second photoresist layer PR2 includes a plurality of separated portions that are separated apart from one another by a gap (e.g., an air gap).

Figure 25:
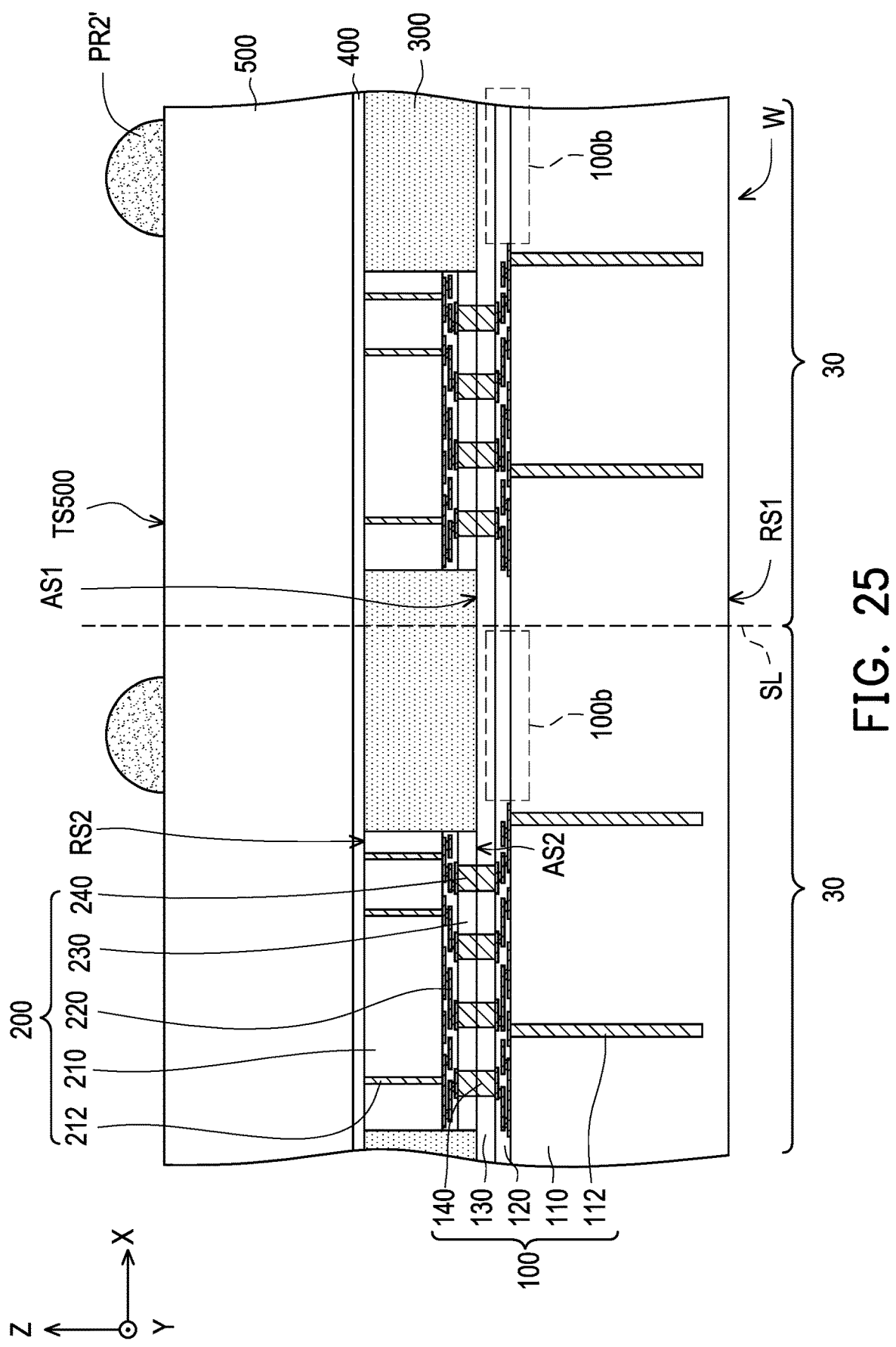

Referring to FIG. 25, in some embodiments, a reflow process is performed on the second photoresist layer PR2 to transform the second photoresist layer PR2 into a second photoresist layer PR2'. In some embodiments, the separated portions of the second photoresist layer PR2 are reshaped during the reflow process to form a plurality of separated, hemispherical portions of the second photoresist layer PR2'. As shown in FIG. 25, positioning locations of the hemispherical portions of the second photoresist layer PR2' correspond to (e.g., overlap with) positioning locations of the optical input/output portions 100*b* of the photonic integrated circuit components 100 in the vertical projection on the photonic wafer W along the direction Z. The details of the reflow process for the second photoresist layer PR2 have been discussed in FIG. 11, and thus are not repeated herein.

Figure 26:
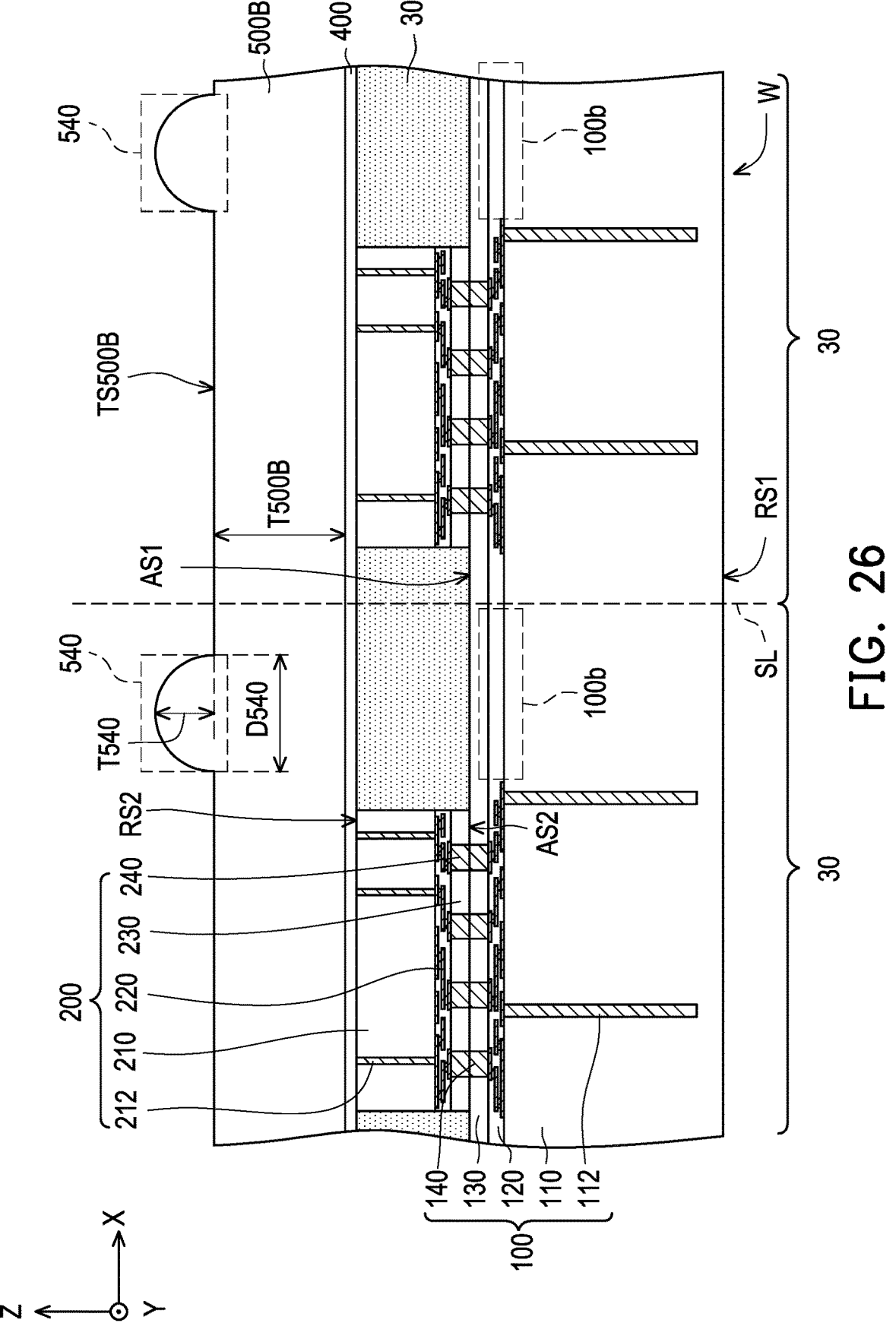

Referring to FIG. 25 and FIG. 26, in some embodiments, a patterning process is performed on the structure depicted in FIG. 25 to form a plurality of lens structures 540 on a supporting structure 500B. For example, the lens structures 540 are disposed atop the supporting structure 500B, where the lens structures 540 are directly posited on a surface TS500B of the supporting structure 500B, as shown in FIG. 26. In some embodiments, the surface TS500B is referred to as an outmost surface of the supporting structure 500B. In some embodiments, the lens structures 540 and the supporting structure 500B are integrally formed. Due to the lens structures 540 are placed atop the supporting structure 500B (e.g., right on the surface TS500B), the supporting structure 500B can be referred to as a thinned optical carrier as a mass amount of the supporting structure 500 is removed during the formation of the lens structures 540. Owing to the lens structures 540, the overall thickness of the package structure 30 is reduced. In some embodiments, the thickness T500B is less than the thickness T500A.

In some embodiments, in the top view of one package structure 30, the arrangement of the lens structures 540 may be similar to or substantial identical to the arrangement of the lens structures 520 as previously discussed in FIG. 14A through FIG. 14C, and thus the details thereof are not repeated herein for brevity. For example, in the top view of one package structure 30, the lens structures 540 may be arranged into a line, an array form with an alignment manner, an array form with a staggered manner, a predetermined pattern with a concentric manner (e.g., a radial arrangement), or any other suitable arrangement complied with the demand and design requirement. The disclosure is not limited thereto. In some embodiments, positioning locations of the lens structures 540 correspond to (e.g., overlap with) positioning locations of the optical input/output portions 100*b* of the photonic integrated circuit components 100 in the vertical projection on the photonic wafer W along the direction Z. For example, the lens structures 540 are optically coupled to the optical input/output portions 100*b* of the photonic integrated circuit components 100 in the photonic wafer W.

In some embodiments, a thickness T540 of the lens structures 540 ranges from about 4 μm to about 15 μm as measured along the direction Z, although other suitable thickness may alternatively be utilized. In some embodiments, a horizontal size D540 (referred to as a critical dimension (CD)) of the lens structures 540 ranges from about 50 μm to about 150 μm as measured along the direction X and/or the direction Y, although other suitable thickness may alternatively be utilized. In some embodiments, a radius of curvature (R) of the lens structures 540 ranges from about 50 μm to about 250 μm, although other suitable thickness may alternatively be utilized. The supporting structure 500B may have a thickness T500B of about 700 μm to about 900 μm as measured along the direction Z, although other suitable thickness may alternatively be utilized.

The patterning process may include an etching process, such as a dry etching. In some embodiments, the formation of the lens structures 540 includes, but not limited to, performing a dry etching on the structure depicted in FIG. 25 to simultaneously etch the second photoresist layer PR2' and the supporting structure 500 at different etching rates so to form the supporting structure 500B with the lens structures 540 disposed thereon. During the dry etching, the topography of the hemispherical portions of the second photoresist layer PR2' is adopted by the lens structures 540. With such, the radius of curvature (ROC) and the thickness T540 of the lens structures 540, which are also considered as the removal amount of the second photoresist layer PR2' and the supporting structure 500, can be controlled by adjusting the material type of the second photoresist layer PR2', the thickness of the hemispherical portions of the second photoresist layer PR2', and the type of an etchant(s) in the drying etching (e.g., the etching selectivities of the second photoresist layer PR2' and the supporting structure 500).

In the disclosure, the relationship between the etching rate of the second photoresist layer PR2' and the etching rate of the supporting structure 500 are not specifically limited herein; and may be adjusted depending on the demand and design requirement of the lens structures 540. The etching rate of the second photoresist layer PR2' may be the same as the etching rate of the supporting structure 500. Alternatively, the etching rate of the second photoresist layer PR2' may be greater than the etching rate of the supporting structure 500. Or alternatively, the etching rate of the second photoresist layer PR2' may be less than the etching rate of the supporting structure 500.

Owing to the forming processes (e.g., material type, photolithography and reflowing) of the second photoresist layer PR2/PR2', the WiD CD uniformity, the radius of curvature (ROC) and the thickness uniformity of the second photoresist layer PR2/PR2' can be well-controlled, so that the desired radius of curvature (ROC), the desired CD and the desired thickness of the lens structures 540 can be easily obtained and controlled by a proper patterning process as mentioned above; thereby improving the uniformities of the radius of curvature (ROC), the WiD critical dimension and the thickness of the lens structures 540. In addition, without using the hard mask layer 50', better coating ability (affecting by the topography of the hard mask layer 50') and ROC uniformity (affecting by an interface adhesion between the second photoresist layer PR2/PR2' and the hard mask layer 50') of the second photoresist layer PR2/PR2' are obtained, and an overlap shift between the second photoresist layer PR2/PR2' and the hard mask layer 50' can be prevented. With such, the CD tuning of the second photoresist layer PR2/PR2' is flexible, and thus the CD tuning of the lens structures 540 is flexible and the manufacturing cost of the lens structures 540 is reduced.

Figure 27:
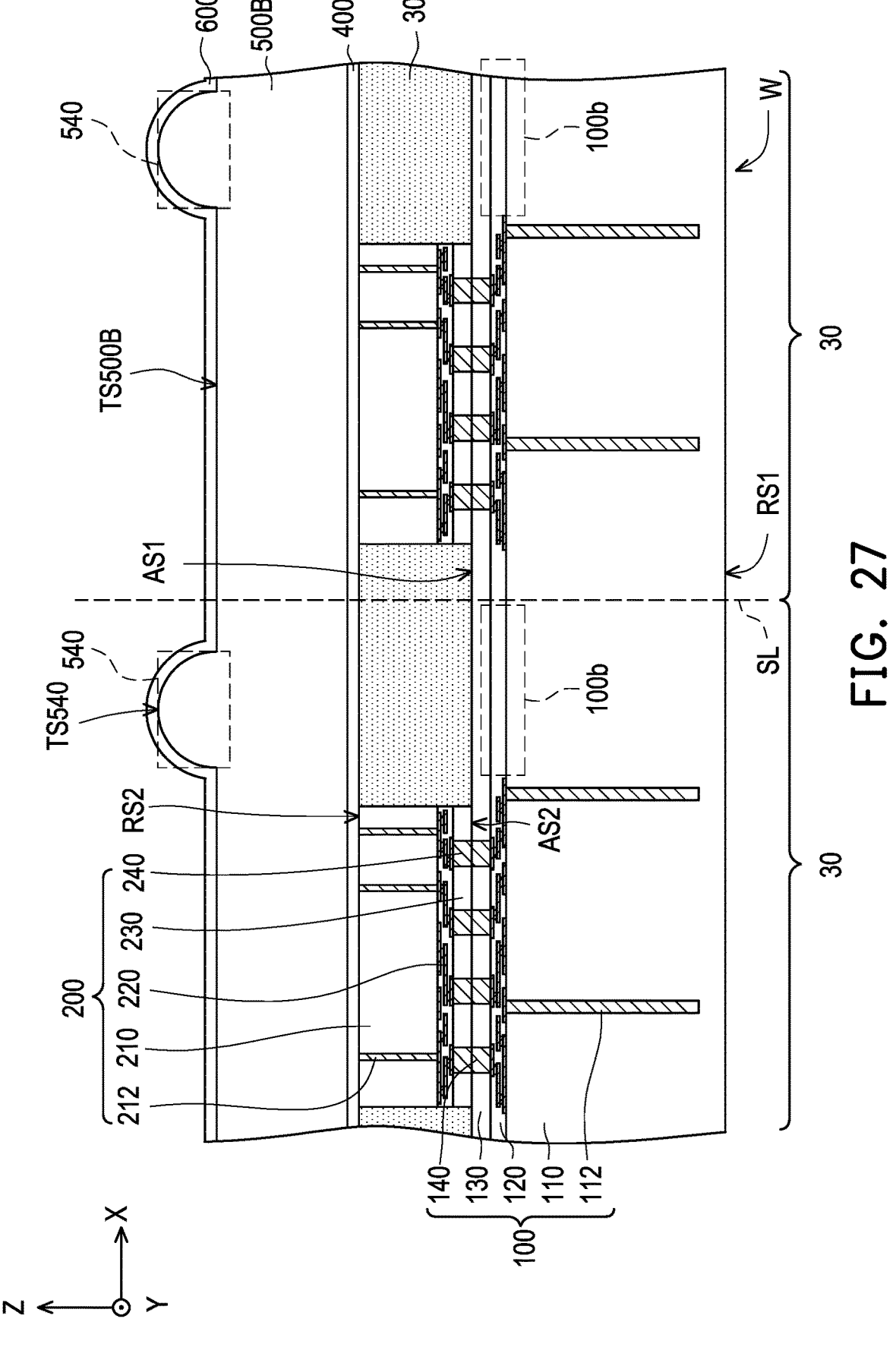

Referring to FIG. 27, in some embodiments, an ARC layer 600 is conformally formed over the lens structures 540 and the supporting structure 500B. For example, the ARC layer 600 is disposed on and in physical contact with surfaces TS540 of the lens structures 540 and the surface TS500B of the supporting structure 500B. The details of the ARC layer 600 have been discussed in FIG. 16, and thus are not repeated herein for brevity.

Figure 28:
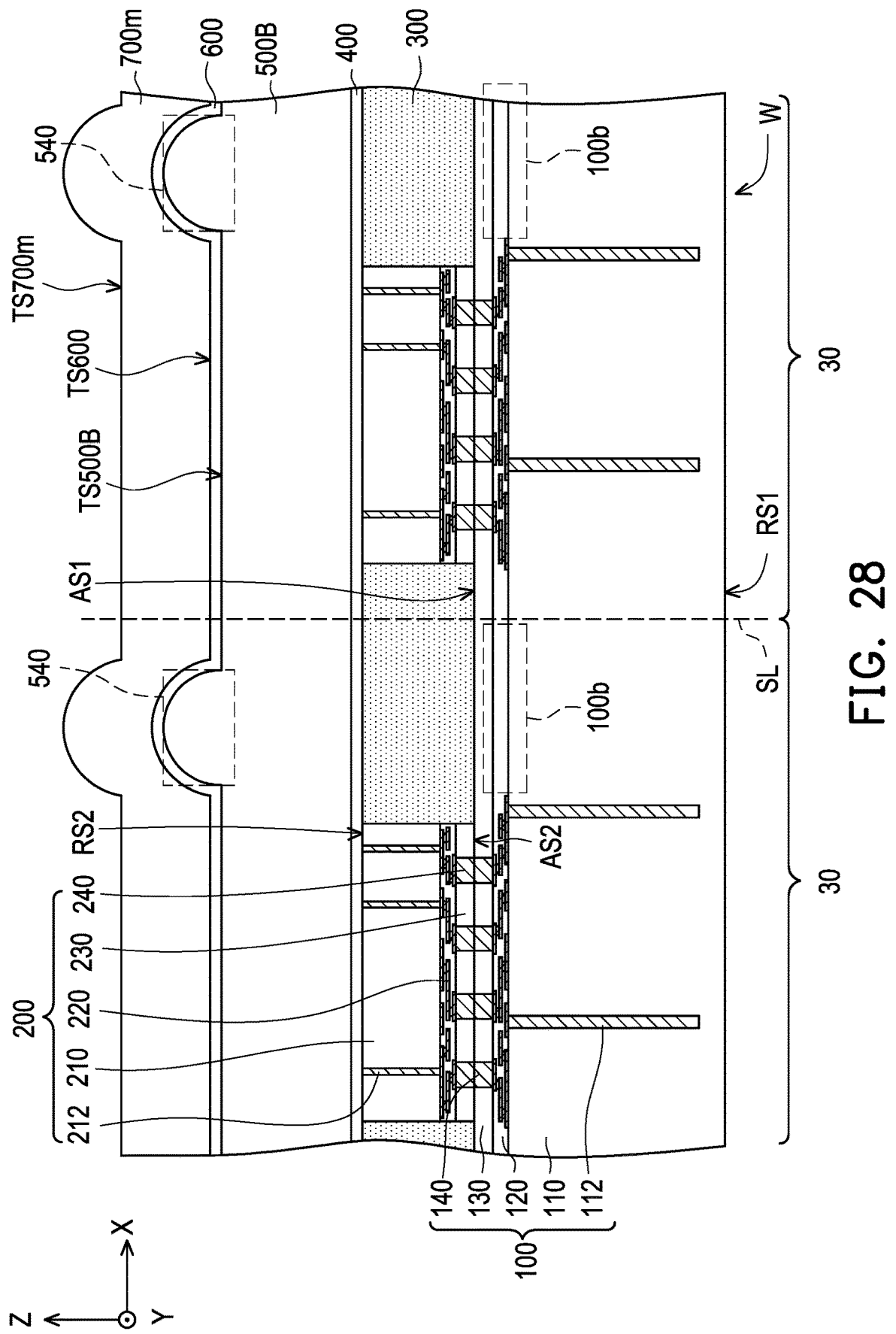

Referring to FIG. 28, in some embodiments, a dielectric material 700*m* is formed over the ARC layer 600. For example, the dielectric material 700*m* is disposed on and in physical contact with the surface TS600 of the ARC layer 600. The details of the dielectric material 700*m* have been discussed in FIG. 17, and thus are not repeated herein for brevity.

Figure 29:
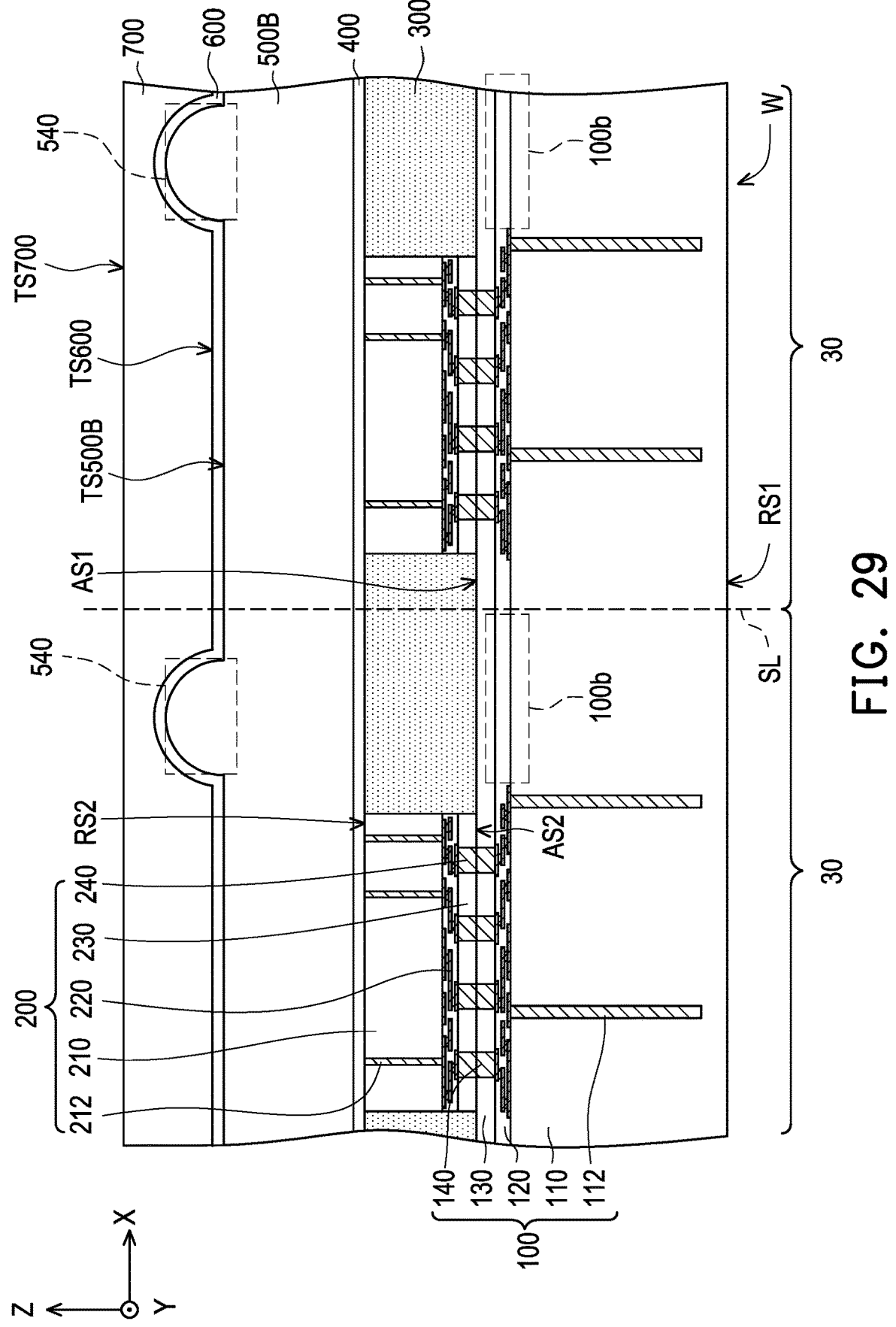

Referring to FIG. 29, in some embodiments, a grinding or polishing process is performed on the dielectric material 700*m* to form a dielectric layer 700 over the ARC layer 600. For example, the dielectric material 700*m* is partially removed until the dielectric material 700*m* is planarized to form the dielectric layer 700 having a surface TS700, where the surface TS700 is planarized and flat. After performing the grinding or polishing process, the ARC layer 600, the supporting structure 500B, and the lens structure 540 are still covered by the dielectric layer 700, as shown in FIG. 29, for example. The dielectric layer 700 is capable of providing protection to the lens structures 540 and the ARC layer 600 disposed underneath thereto, in the disclosure. The details of the dielectric material 700 and the planarizing process have been discussed in FIG. 18, and thus are not repeated herein for brevity.

Figure 30:
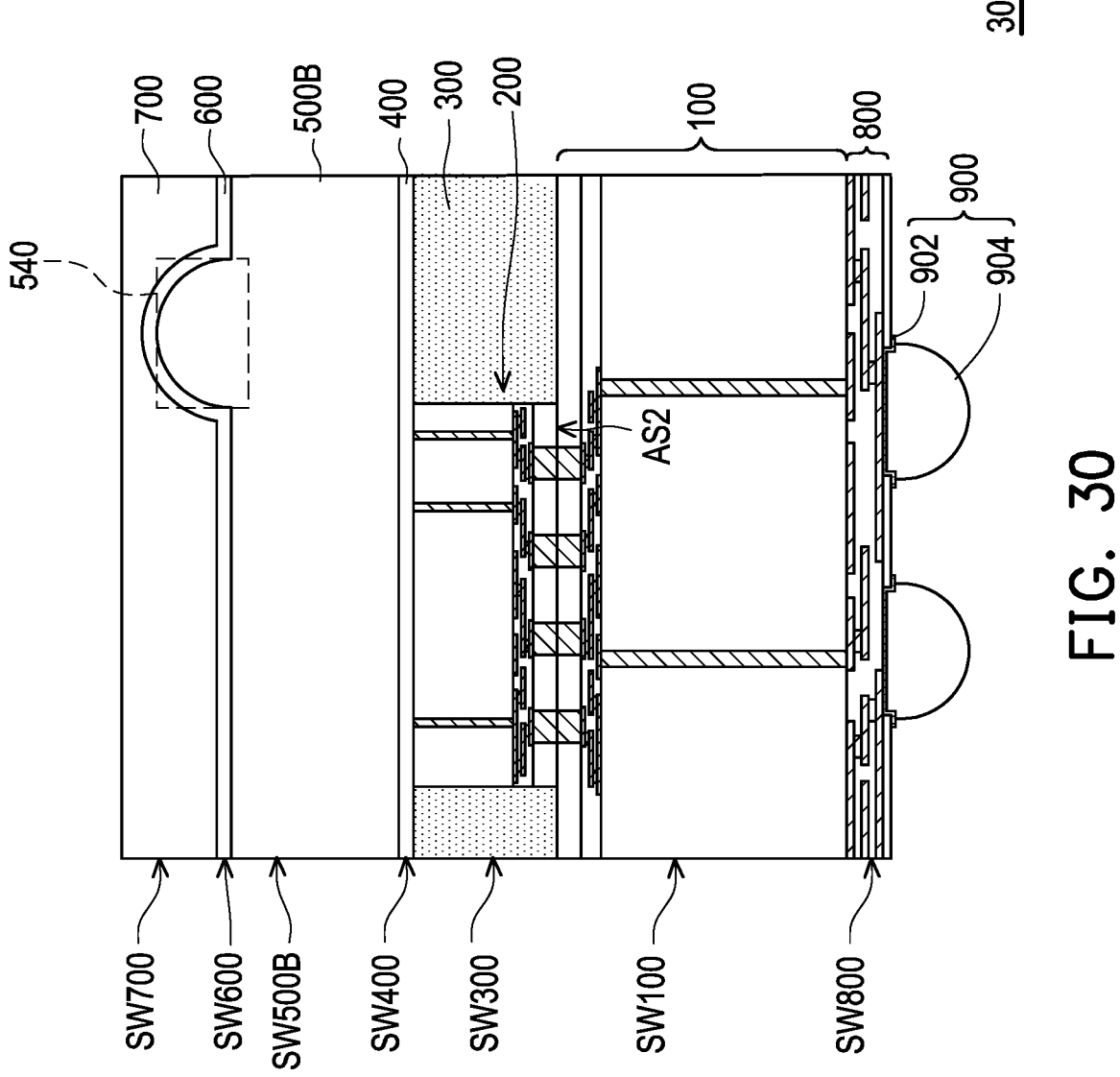
Figure 31:
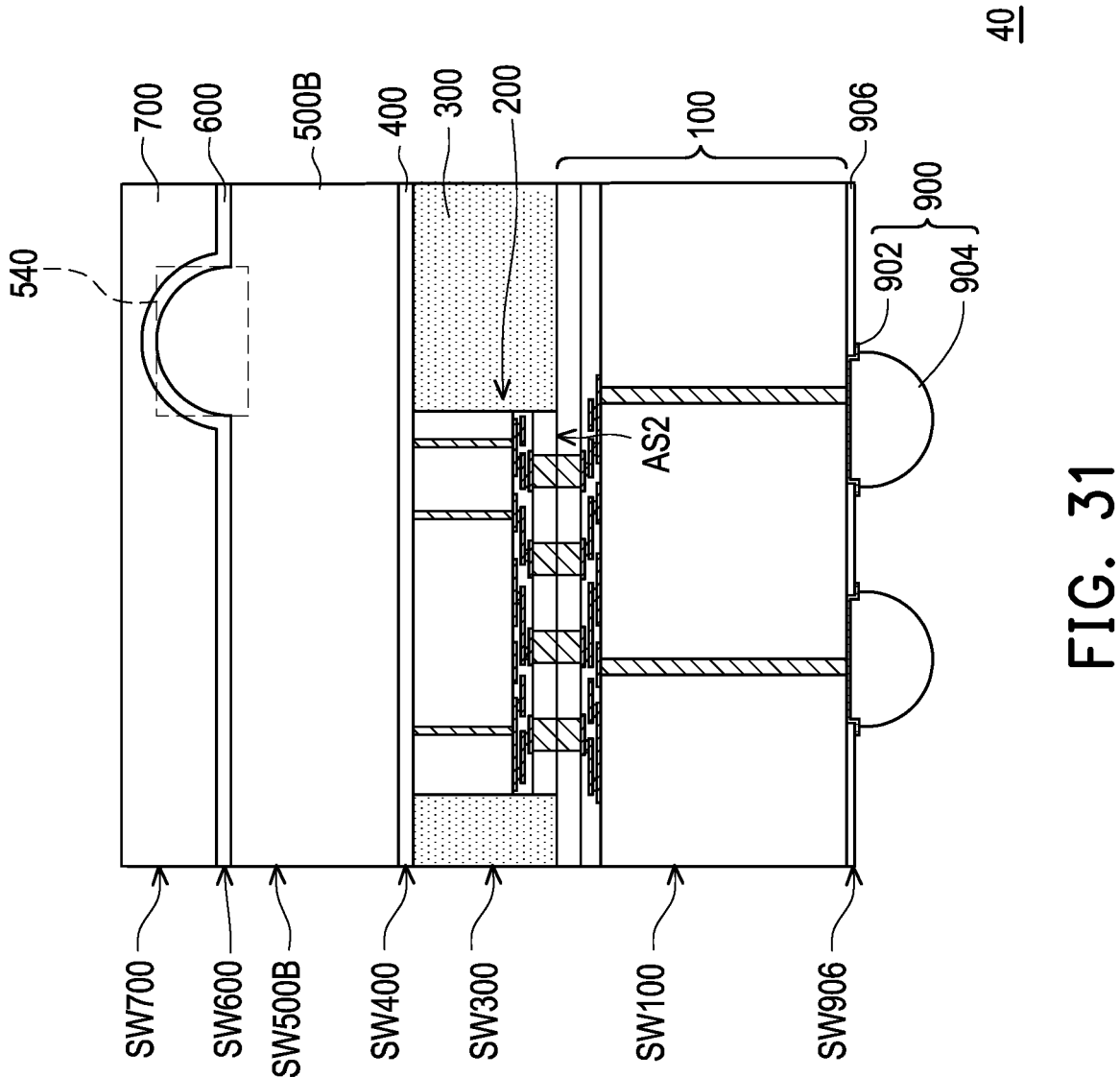
FIG. 31 is a schematic cross-sectional view of a package structure in accordance with some embodiments of the disclosure.

Referring to FIG. 30, in some embodiments, the processes previously described in FIG. 19 through FIG. 22 are performed to the structure depicted in FIG. 29 to obtain individual and separated package structures 30. Up to here, the package structure 30 is manufactured. Only one package structure 30 is shown in FIG. 30 for illustrative purposes and simplicity. As shown in FIG. 30, the package structure 30 include the photonic integrated circuit component 100, the electric integrated circuit component 200, the insulating encapsulation 300, the ARC layer 400, the supporting structure 500B having lens structure 540 formed thereon, the ARC layer 600, the dielectric layer 700, the redistribution circuit structure 800, and the conductive elements 900, in some embodiments. For example, the electric integrated circuit component 200 is stacked on and electrically connected to the photonic integrated circuit component 100, without overlapping the optical input/output portion 100*b* of the photonic integrated circuit component 100. As shown in FIG. 30, the insulating encapsulation 300 may laterally encapsulate the electric integrated circuit component 200 and cover the photonic integrated circuit component 100 exposed by the electric integrated circuit component 200.

In some embodiments, the supporting structure 500B with at least one lens structures 540 formed thereon is disposed on the insulating encapsulation 300 and the electric integrated circuit component 200, where the at least one lens structures 540 is optically connected to the optical input/output portion 100*b* of the photonic integrated circuit component 100. For example, the insulating encapsulation 300 and the electric integrated circuit component 200 are disposed between the supporting structure 500B and the photonic integrated circuit component 100. As shown in FIG. 30, the dielectric layer 700 serving as a protection layer or film may be disposed on and completely covers the at least one lens structures 540 and the supporting structure 500B. In some embodiments, the ARC layer 400 is sandwiched between the supporting structure 500B and the insulating encapsulation 300, between the at least one lens structures 540 and the insulating encapsulation 300, and between the supporting structure 500B and the electric integrated circuit component 200. In some embodiments, the ARC layer 600 is sandwiched between the supporting structure 500B and the dielectric layer 700 and between the at least one lens structures 540 and dielectric layer 700.

As shown in FIG. 30, the redistribution circuit structure 800 may be disposed on and electrically connected to the photonic integrated circuit component 100, and the conductive elements 900 are disposed on and electrically connected to the redistribution circuit structure 800. For example, the redistribution circuit structure 800 is sandwiched between the photonic integrated circuit component 100 and the conductive elements 900. The conductive elements 900 may be electrically connected to the photonic integrated circuit component 100 through the redistribution circuit structure 800.

In some embodiments, a sidewall SW700 of the dielectric layer 700, a sidewall SW600 of the ARC layer 600, a sidewall SW500A of the supporting structure 500A, a sidewall SW400 of the ARC layer 400, a sidewall SW300 of the insulating encapsulation 300, a sidewall SW100 of the photonic integrated circuit component 100, and a sidewall SW800 of the redistribution circuit structure 800 are substantially aligned to each other, as shown in FIG. 30. In the case, the sidewall SW700 of the dielectric layer 700, the sidewall SW600 of the ARC layer 600, the sidewall SW500A of the supporting structure 500A, the sidewall SW400 of the ARC layer 400, the sidewall SW300 of the insulating encapsulation 300, the sidewall SW100 of the photonic integrated circuit component 100, and the sidewall SW800 of the redistribution circuit structure 800 together constitute a sidewall of the package structure 30. In the package structure 30, for example or example, on the top view (e.g., the X-Y plane) in direction Z, a projection area of the electric integrated circuit component 200 is located within a projection area of the photonic integrated circuit component 100, and a projection area of the at least one lens structure 540 is located within the projection area of the photonic integrated circuit component 100 next to the projection area of the electric integrated circuit component 200. With such, the at least one lens structure 540 is optically coupled to the optical input/output portions 100*b* of the photonic integrated circuit component 100.

Alternatively, the redistribution circuit structure 800 may be omitted, see a package structure 40 of FIG. 31. As shown in FIG. 31, a dielectric layer 906 with a plurality of openings (not labelled) may be optionally formed on the first rear surface RS1' of the photonic integrated circuit component 100, where the plurality of openings exposes the surfaces BS112 of the first TSVs 112 of the photonic integrated circuit component 200 for electrical connection to any other external component(s), e.g., conductive elements 900. The details of the dielectric layer 906 have been discussed in FIG. 23, and thus are not repeated herein. For example, in the package structure 40, on the top view (e.g., the X-Y plane) in direction Z, a projection area of the electric integrated circuit component 200 is located within a projection area of the photonic integrated circuit component 100, and a projection area of the at least one lens structure 540 is located within the projection area of the photonic integrated circuit component 100 next to the projection area of the electric integrated circuit component 200. With such, the at least one lens structure 540 is optically coupled to the optical input/output portions 100*b* of the photonic integrated circuit component 100.

In some embodiments, as shown in FIG. 31, a sidewall SW700 of the dielectric layer 700, a sidewall SW600 of the ARC layer 600, a sidewall SW500A of the supporting structure 500A, a sidewall SW400 of the ARC layer 400, a sidewall SW300 of the insulating encapsulation 300, a sidewall SW100 of the photonic integrated circuit component 100, and a sidewall SW906 of the dielectric layer 906 are substantially aligned to each other. In the case, the sidewall SW700 of the dielectric layer 700, the sidewall SW600 of the ARC layer 600, the sidewall SW500A of the supporting structure 500A, the sidewall SW400 of the ARC layer 400, the sidewall SW300 of the insulating encapsulation 300, the sidewall SW100 of the photonic integrated circuit component 100, and the sidewall SW906 of the dielectric layer 906 together constitute a sidewall of the package structure 40.

Some modification may be adopted by the package structures 10, 20, 30, 40, and/or modifications thereof. In the embodiments of which the second TSVs 212 are presented and exposed by the insulating encapsulation 300, an additional redistribution circuit structure and a plurality of conductive pillars can be formed in the package structures 10, 20, 30, 40, and/or modifications thereof. In some embodiments, the conductive pillars are through integrated vias. The material of the conductive pillars may include a metal material such as copper or copper alloys, or the like. The formation and material of the additional redistribution circuit structure may be similar to or substantially identical to the process and material of the redistribution circuit structure 800 of FIG. 21, and thus are not repeated herein. In the case, the additional redistribution circuit structure is formed on the surface TS300 of the insulating encapsulation 300 for electrically connecting to the electric integrated circuit component 100 by connecting to the second TSVs 212, while the conductive pillars are disposed in and penetrating through the insulating encapsulation 300. The conductive pillars are disposed between and electrically connects the additional redistribution circuit structure and the first interconnection structure 120 of the photonic integrated circuit component 200, for example. In some embodiments, in the vertical projection on the photonic integrated circuit component 100 in the direction Z, the conductive pillars are overlapped with the insulating encapsulation 300 and offset from (e.g., next to) the optical input/output portions 100*b*. In addition, a portion of the additional redistribution circuit structure overlapping with the optical input/output portions 100*b* has no metallization features.

Figure 32:
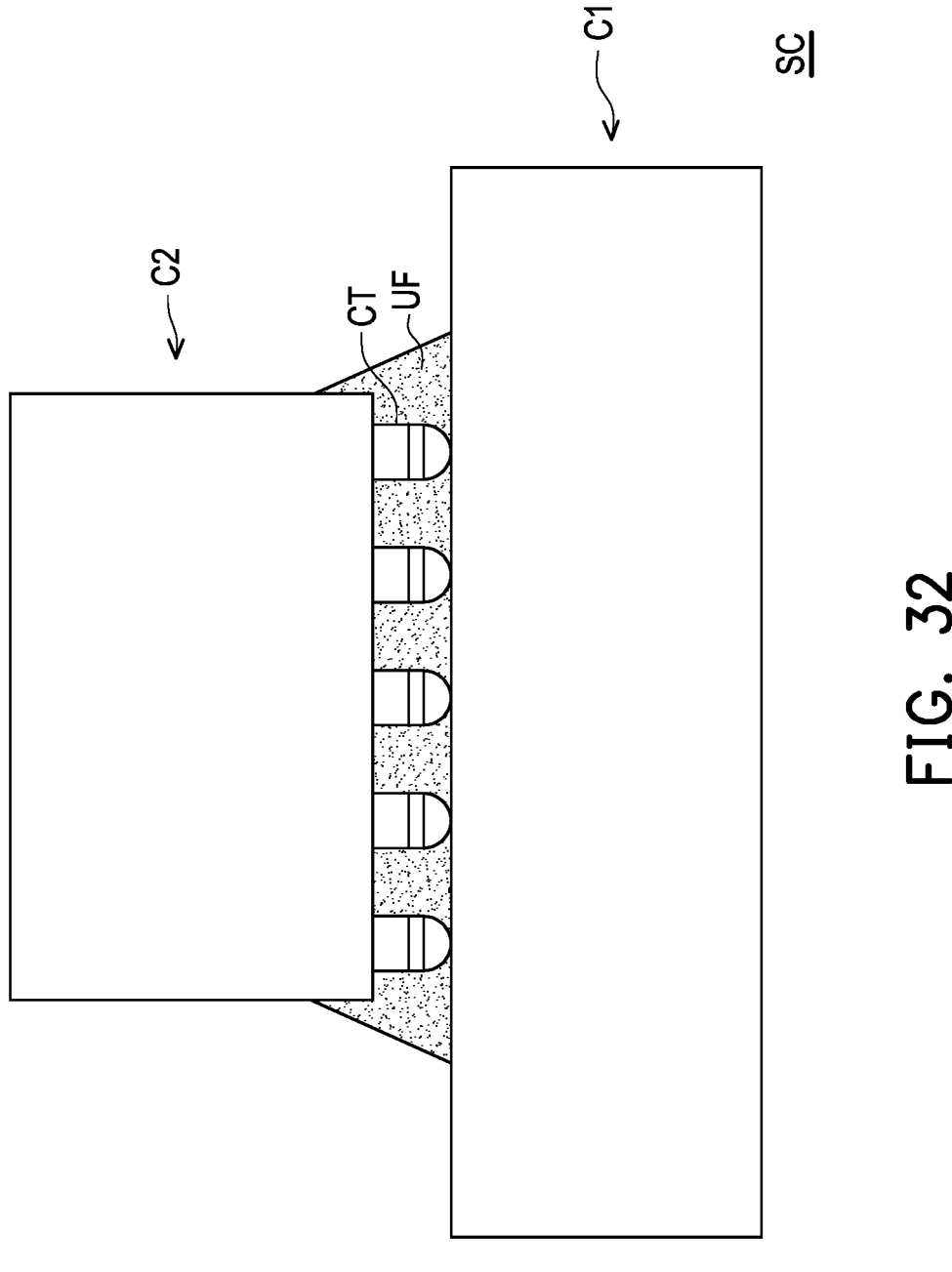
FIG. 32 is a schematic cross-sectional view of a package structure in accordance with some embodiments of the disclosure.

In some embodiments, the package structures 10, 20, 30, 40, and/or modifications thereof may be further mounted onto a package substrate, and the package substrate may be a printed circuit board, an interposer (e.g., a silicon interposer including through silicon vias) and so on. FIG. 32 is a schematic cross-sectional view showing an application of a semiconductor structure in accordance with some embodiments of the disclosure. The elements similar to or substantially the same as the elements described previously will use the same reference numbers, and certain details or descriptions (e.g., the materials, formation processes, positioning configurations, electrical connections, etc.) of the same elements would not be repeated herein.

Referring to FIG. 32, in some embodiments, a component assembly SC including a first component C1 and a second component C2 disposed over the first component C1 is provided. The first component C1 may be or may include a circuit structure, such as a mother board, a package substrate, another printed circuit board (PCB), a printed wiring board, an interposer, and/or other carrier that is capable of carrying integrated circuits. In some embodiments, the second component C2 mounted on the first component C1 is similar to one of the package structures 10, 20, 30, 40, and/or modifications thereof. For example, one or more the package structures 10, 20, 30, 40, and/or modifications thereof (e.g., 10, 20, 30, 40, and/or modifications thereof) may be electrically coupled to the first component C1 through a plurality of terminals CT. The terminals CT may be the conductive elements 900 as described in FIG. 22, FIG. 23, FIG. 30, and FIG. 31.

In some embodiments, an underfill UF is formed between the gap of the first component C1 and the second component C2 to at least laterally cover the terminals CT. Alternatively, the underfill UF is omitted. The underfill UF may be any acceptable material, such as a polymer, epoxy resin, molding underfill, or the like, for example. In one embodiment, the underfill may be formed by underfill dispensing, a capillary flow process, or any other suitable method. Owing to the underfill UF, a bonding strength between the first component C1 and the second component C2 is enhanced.

In some embodiments, the package structures 10, 20, 30, 40, and/or modifications thereof may be integrated in different package types or modules, such as an integrated Fan-Out (InFO) package, an InFO package having a Package-on-Package (PoP) structure, a chip-on-wafer-on-substrate (CoWoS) package, a flip chip package of an InFO package, or the like. The disclosure is not limited thereto.

In accordance with some embodiments, a package structure includes a package structure includes an optical die, an optical die, a supporting structure, and a lens structure. The optical die includes a photonic region. The optical die is disposed on and electrically coupled to the optical die. The supporting structure is disposed on the optical die, where the electric die is disposed between the supporting structure and the optical die. The lens structure is disposed on the supporting structure and optically coupled to the photonic region of the optical die, where the supporting structure is disposed between the lens structure and the electric die.

In accordance with some embodiments, a package structure includes a first integrated circuit component, a second integrated circuit component, an optical transparent substrate, a first anti-reflection layer, and a second anti-reflection layer. The first integrated circuit component includes an electric bonding region and an optical input/output region next thereto. The second integrated circuit component is disposed on and electrically coupled to the electric bonding region of the first integrated circuit component, where in a vertical projection on the first integrated circuit component along a stacking direction of the first integrated circuit component and the second integrated circuit component, the second integrated circuit component is offset from the optical input/output region and overlapped with the electric bonding region. The optical transparent substrate is disposed on the second integrated circuit component, where the optical transparent substrate includes at least one lens structure optically coupling to the optical input/output region and having an outermost surface, and the outermost surface is a convex surface away from the optical input/output region. The first anti-reflection layer is disposed between the second integrated circuit component and the optical transparent substrate. The second anti-reflection layer is disposed on the optical transparent substrate and covers the outermost surface of the at least one lens structure, where the optical transparent substrate and the at least one lens structure are between the first anti-reflection layer and the second anti-reflection layer.

In accordance with some embodiments, a method of manufacturing a package structure includes the following steps: providing an optical die comprising a photonic region; disposing at least one electric die over the optical die, the electric die being electrically coupled to the optical die; laterally encapsulating the at least one electric die in an insulating encapsulation; disposing a supporting structure over the at least one electric die, the electric die being disposed between the supporting structure and the optical die; and forming a lens structure over the supporting structure and being optically coupled to the photonic region of the optical die, the supporting structure being disposed between the lens structure and the electric die.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A package structure, comprising:
an optical die, comprising a photonic region;
an electric die, disposed on and electrically coupled to the optical die;
a supporting structure, disposed on the optical die, the electric die being disposed between the supporting structure and the optical die along a stacking direction of the optical die and the electric die; and
a lens structure, disposed on the supporting structure and optically coupled to the photonic region of the optical die, the supporting structure being disposed between the lens structure and the electric die along the stacking direction.

2. The package structure of claim 1, wherein the lens structure is embedded inside the supporting structure.

3. The package structure of claim 2, wherein an outermost surface of the lens structure is lower than an outermost surface of the supporting structure.

4. The package structure of claim 2, wherein an outermost surface of the lens structure is substantially the same as an outermost surface of the supporting structure.

5. The package structure of claim 2, wherein an outermost surface of the lens structure is above an outermost surface of the supporting structure.

6. The package structure of claim 1, wherein the lens structure is disposed atop of an outermost surface of the supporting structure.

7. The package structure of claim 1, further comprising:
an insulating encapsulation, laterally encapsulating the electric die and covering a portion of the optical die exposed by the electric die,
wherein a sidewall of the package structure comprises a sidewall of the insulating encapsulation, a sidewall of the optical die, and a sidewall of the supporting structure.

8. The package structure of claim 7, further comprising:
a first optical film, disposed between the insulating encapsulation and the supporting structure, the first optical film is in contact with the electric die; and
a second optical film, disposed on the supporting structure, the supporting structure being between the first optical film and the second optical film, wherein an outermost surface of the lens structure and an outermost surface of the supporting structure are covered by the second optical film,
wherein the sidewall of the package structure further comprises a sidewall of the first optical film and a sidewall of the second optical film.

9. The package structure of claim 8, further comprising:
conductive terminals, disposed on and electrically coupled to the optical die, the optical die being between the conductive terminals and the electric die; and
a protection layer, disposed on the second optical film, the second optical film being between the supporting structure and the protection layer,
wherein the sidewall of the package structure further comprises a sidewall of the protection layer.

10. The package structure of claim 9, further comprising:
a redistribution circuit structure, disposed on and electrically coupled to the optical die, the redistribution circuit structure being between and electrically coupling the optical die and the conductive terminals,
wherein the sidewall of the package structure further comprises a sidewall of the redistribution circuit structure.

11. A method of manufacturing a package structure, comprising:

providing an optical die comprising a photonic region;

disposing at least one electric die over the optical die, the electric die being electrically coupled to the optical die;

laterally encapsulating the at least one electric die in an insulating encapsulation;

disposing a supporting structure over the at least one electric die, the electric die being disposed between the supporting structure and the optical die along a stacking direction of the optical die and the electric die; and forming a lens structure over the supporting structure and being optically coupled to the photonic region of the optical die, the supporting structure being disposed between the lens structure and the electric die along the stacking direction.

12. The method of claim 11, wherein forming the lens structure over the supporting structure comprises:

forming a photoresist layer over the supporting structure, a positioning location of the photoresist layer being within a positioning location of the photonic region in a vertical projection on the optical die along the stacking direction;

reshaping, by a reflowing process, the photoresist layer into a hemispherical shape; and patterning, using the reshaped photoresist layer as a mask, the supporting structure to form the lens structure over the supporting structure, wherein in the patterning, the reshaped photoresist layer and a portion of the supporting structure are removed.

13. The method of claim 12, forming the lens structure over the supporting structure further comprises:

forming a hard mask layer having a first opening over the supporting structure prior to forming the photoresist layer, a positioning location of the first opening being within the positioning location of the photonic region in the vertical projection on the optical die along the stacking direction, wherein:

forming the photoresist layer over the supporting structure comprises disposing the photoresist layer in the first opening of the hard mask layer, and in the patterning, the hard mask layer, the reshaped photoresist layer and a portion of the supporting structure are removed.

14. The method of claim 11, further comprising:

deposing a first optical film over the at least one electric die and the insulating encapsulation prior to disposing the supporting structure over the at least one electric die;

deposing a second optical film over the lens structure and the supporting structure;

forming a protection layer over the second optical film, the second optical film being disposed between the protection layer and the lens structure; and forming conductive terminals over the photonic die after forming the protection layer, the conductive terminals being electrically coupled to the photonic die.

15. The method of claim 14, further comprising:

disposing a redistribution circuit structure on the photonic die after forming the protection layer and prior to forming the conductive terminals, the conductive terminals being electrically coupled to the photonic die through the redistribution circuit structure.

16. A package structure, comprising:

an optical die, comprising a photonic region;

an electric die, disposed over and electrically coupled to the optical die, wherein the electric die has a first surface distributed with conductors and a second surface opposite to the first surface, the first surface is closer to the optical die than the second surface along a stacking direction of the optical die and the electric die;

a supporting structure, disposed over the optical die, the electric die being disposed between the supporting structure and the optical die; and a lens structure, disposed over the supporting structure and optically coupled to the photonic region of the optical die, the supporting structure being disposed between the lens structure and the electric die.

17. The package structure of claim 16, wherein the lens structure is embedded inside the supporting structure or the lens structure is disposed atop of an outermost surface of the supporting structure.

18. The package structure of claim 16, further comprising:

an insulating encapsulation, encapsulating the electric die and covering a portion of the optical die exposed by the electric die, wherein a sidewall of the package structure comprises a sidewall of the insulating encapsulation, a sidewall of the optical die, and a sidewall of the supporting structure.

19. The package structure of claim 16, further comprising:

a first optical film, disposed between the electric die and the supporting structure, the first optical film is in contact with the electric die and the supporting structure; and a second optical film, disposed over the supporting structure, the supporting structure being between the first optical film and the second optical film, wherein an outermost surface of the lens structure and an outermost surface of the supporting structure are in contact with the second optical film, wherein a sidewall of the package structure comprises a sidewall of the optical die, a sidewall of the supporting structure, a sidewall of the first optical film, and a sidewall of the second optical film.

20. The package structure of claim 16, further comprising:

a redistribution circuit structure, disposed over and electrically coupled to the optical die, the optical die being between and electrically coupling the redistribution circuit structure and the electric die, conductive terminals, disposed over and electrically coupled to the redistribution circuit structure, the redistribution circuit structure being between and electrically coupling the optical die and the conductive terminals; and a protection layer, disposed over the supporting structure, the supporting structure being between the electric die and the protection layer, wherein a sidewall of the package structure comprises a sidewall of the optical die, a sidewall of the supporting structure, a sidewall of the redistribution circuit structure, and a sidewall of the protection layer.

* * * * *